United States Patent
Wong et al.

(10) Patent No.: US 8,830,109 B1
(45) Date of Patent: Sep. 9, 2014

(54) SWITCHABLE CONDUCTANCE PIPELINE ANALOG-TO-DIGITAL CONVERSION

(71) Applicant: Semtech Corporation, Camarillo, CA (US)

(72) Inventors: Ark-Chew Wong, Irvine, CA (US); Masashi Yamagata, Torrance, CA (US)

(73) Assignee: Semtech Corporation, Camarillo, CA (US)

( * ) Notice: Subject to any disclaimer, the term of this patent is extended or adjusted under 35 U.S.C. 154(b) by 9 days.

(21) Appl. No.: 13/797,522

(22) Filed: Mar. 12, 2013

(51) Int. Cl.
 *H03M 1/50* (2006.01)
 *H03M 1/12* (2006.01)
 *H03M 1/00* (2006.01)
 *H03M 1/06* (2006.01)

(52) U.S. Cl.
 CPC ...... *H03M 1/12* (2013.01); *H03M 1/00* (2013.01); *H03M 1/0695* (2013.01)
 USPC ........... 341/161; 341/120; 341/162; 341/172; 341/155; 341/143

(58) Field of Classification Search
 CPC ........... H03M 1/00; H03M 1/12; H03M 1/68; H03M 1/007; H03M 1/167; H03M 1/1235; H03M 7/14; H03M 2201/03; H03M 2201/3121; H01C 17/22
 USPC .................................................. 341/120–172
 See application file for complete search history.

(56) References Cited

U.S. PATENT DOCUMENTS

| | | | | |
|---|---|---|---|---|
| 5,369,407 A * | 11/1994 | Yung et al. | ..... | 341/172 |
| 5,455,582 A * | 10/1995 | Valdenaire | ..... | 341/154 |
| 5,654,709 A * | 8/1997 | Miyashita | ..... | 341/122 |
| 5,821,893 A * | 10/1998 | Kumamoto et al. | ..... | 341/161 |
| 7,259,709 B2 * | 8/2007 | Ogita et al. | ..... | 341/172 |
| 7,436,344 B2 * | 10/2008 | Ogita et al. | ..... | 341/172 |
| 7,518,348 B1 * | 4/2009 | Kobayashi | ..... | 323/282 |
| 7,720,452 B2 * | 5/2010 | Miyahara et al. | ..... | 455/191.1 |

OTHER PUBLICATIONS

Chang, et al., "Sub-1-V Design Techniques for High-Linearity Multistage/Pipelined Analog-to-Digital Converters," IEEE Transactions on Circuits and Systems—I: Regular Papers, Jan. 2005, pp. 1-12, vol. 52, No. 1.
Poulton, et al., "A 4G Sample/s 8b ADC in 0.35μm CMOS" ISSCC 2002, Session 10—High-Speed ADCs, 2002, 10.1.
Poulton, et al., "A 4G Sample/s 8b ADC in 0.35μm CMOS" ISSCC 2002 Visuals Supplement, Session 10—High-Speed ADCs, 2002, 10.1, pp. 126-127 and 432-434.
Poulton, et al., "A 20GS/s 8b ADC with a 1MB Memory in 0,18μm CMOS," ISSCC 2003, Session 18—Nyquist A/D Converters, 2003, 18.1.

(Continued)

*Primary Examiner* — Lam T Mai
(74) *Attorney, Agent, or Firm* — McDermott Will & Emery LLP

(57) ABSTRACT

A pipeline analog-to-digital converter is disclosed. An example of a pipeline analog-to-digital converter comprises a plurality of stages. Each of the plurality of stages comprises an analog-to-digital conversion circuit comprising a comparator configured to produce an n-bit digital domain output; and a switchable conductance digital-to-analog conversion circuit operatively coupled to the comparator and configured to switch between at least two conductance values in response to a value of the n-bit digital domain output.

22 Claims, 18 Drawing Sheets

(56) References Cited

OTHER PUBLICATIONS

Murmann, et al., "A 12b 75MS/s Pipelined ADC using Open-Loop Residue Amplification," ISSCC 2003, Session 18—Nyquist A/D Converters, 2003, 18.6.

Anthony, et al., "A Process-Scalable Low-Power Charge-Domain 13-bit Pipeline ADC," IEEE 2008 Symposium on VLSI Circuits Digest of Technical Papers, 2008, pp. 222-223.

Sepke, et al., "Comparator-Based Switched-Capacitor Circuits for Scaled CMOS Technologies," ISSCC 2006, Session 12—Nyquist ADCs, 2003, 12.4.

* cited by examiner

| Stage | Switching Resistance/Conductance | | | | Rmax [Ω] | Rmin [Ω] | ΔR [Ω] | Comments |
|---|---|---|---|---|---|---|---|---|
| | R1 [Ω] | G1 [mhos] | R2 [Ω] | G2 [mhos] | | | | |
| 1 | 750.00 | 1.3333E-03 | 1500 | 6.6667E-04 | 750.0000 | 375.0000 | 375.0000 | MSB |
| 2 | 600.00 | 1.6667E-03 | 3000 | 3.3333E-04 | 600.0000 | 428.5714 | 171.4286 | |
| 3 | 545.45 | 1.8333E-03 | 6000 | 1.6667E-04 | 545.4545 | 461.5385 | 83.9161 | |
| 4 | 521.74 | 1.9167E-03 | 12000 | 8.3333E-05 | 521.7391 | 480.0000 | 41.7391 | |
| 5 | 510.64 | 1.9583E-03 | 24000 | 4.1667E-05 | 510.6383 | 489.7959 | 20.8424 | |
| 6 | 505.26 | 1.9792E-03 | 48000 | 2.0833E-05 | 505.2632 | 494.8454 | 10.4178 | |
| 7 | 502.62 | 1.9896E-03 | 96000 | 1.0417E-05 | 502.6178 | 497.4093 | 5.2085 | |
| 8 | 501.31 | 1.9948E-03 | 192000 | 5.2083E-06 | 501.3055 | 498.7013 | 2.6042 | LSB |

US 8,830,109 B1

SWITCHABLE CONDUCTANCE PIPELINE ANALOG-TO-DIGITAL CONVERSION

FIELD

The disclosure relates in general to analog-to-digital conversion, and more particularly to, pipeline analog-to-digital conversion.

BACKGROUND

Pipeline analog-to-digital converters are typically used in applications that require a high sample rate and high resolution. A pipeline analog-to-digital converter includes a number of stages whereby each stage generates a number of bits. Most pipeline analog-to-digital converters employ switched-capacitor circuitry and utilize high-gain, high-precision, and/or high-bandwidth operational amplifiers for inter-stage gain.

SUMMARY

Aspects of the subject technology relate to apparatus and methods for switched-conductance pipeline analog-to-digital conversion.

In one aspect, a pipeline analog-to-digital converter (ADC) comprises a plurality of stages. Each of the plurality of stages comprises an analog-to-digital conversion circuit comprising a comparator configured to produce an n-bit digital domain output; and a switchable conductance digital-to-analog conversion circuit operatively coupled to the comparator and configured to switch between at least two conductance values in response to a value of the n-bit digital domain output.

In one aspect, a method of analog-to-digital conversion comprises setting a current difference in an (N) pipeline analog-to-digital converter stage to produce a first positive input voltage (Vp) and a first negative input voltage (Vn); comparing the first positive input voltage (Vp) and the first negative input voltage (Vn); and switching conductance of a digital-to-analog conversion circuit based on said comparing the first positive input voltage (Vp) and the first negative input voltage (Vn).

In one aspect, a device for performing analog-to-digital conversion comprises means for setting a current difference in an (N) pipeline analog-to-digital converter stage to produce a first positive input voltage (Vp) and a first negative input voltage (Vn); means for comparing the first positive input voltage (Vp) and the first negative input voltage (Vn); and means for switching conductance of a digital-to-analog conversion circuit based on said comparing the first positive input voltage (Vp) and the first negative input voltage (Vn).

It is understood that various configurations of the subject technology will become readily apparent to those skilled in the art from the disclosure, wherein various configurations of the subject technology are shown and described by way of illustration. As will be realized, the subject technology is capable of other and different configurations and its several details are capable of modification in various other respects, all without departing from the scope of the subject technology. Accordingly, the summary, drawings and detailed description are to be regarded as illustrative in nature and not as restrictive.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

Figure 1:
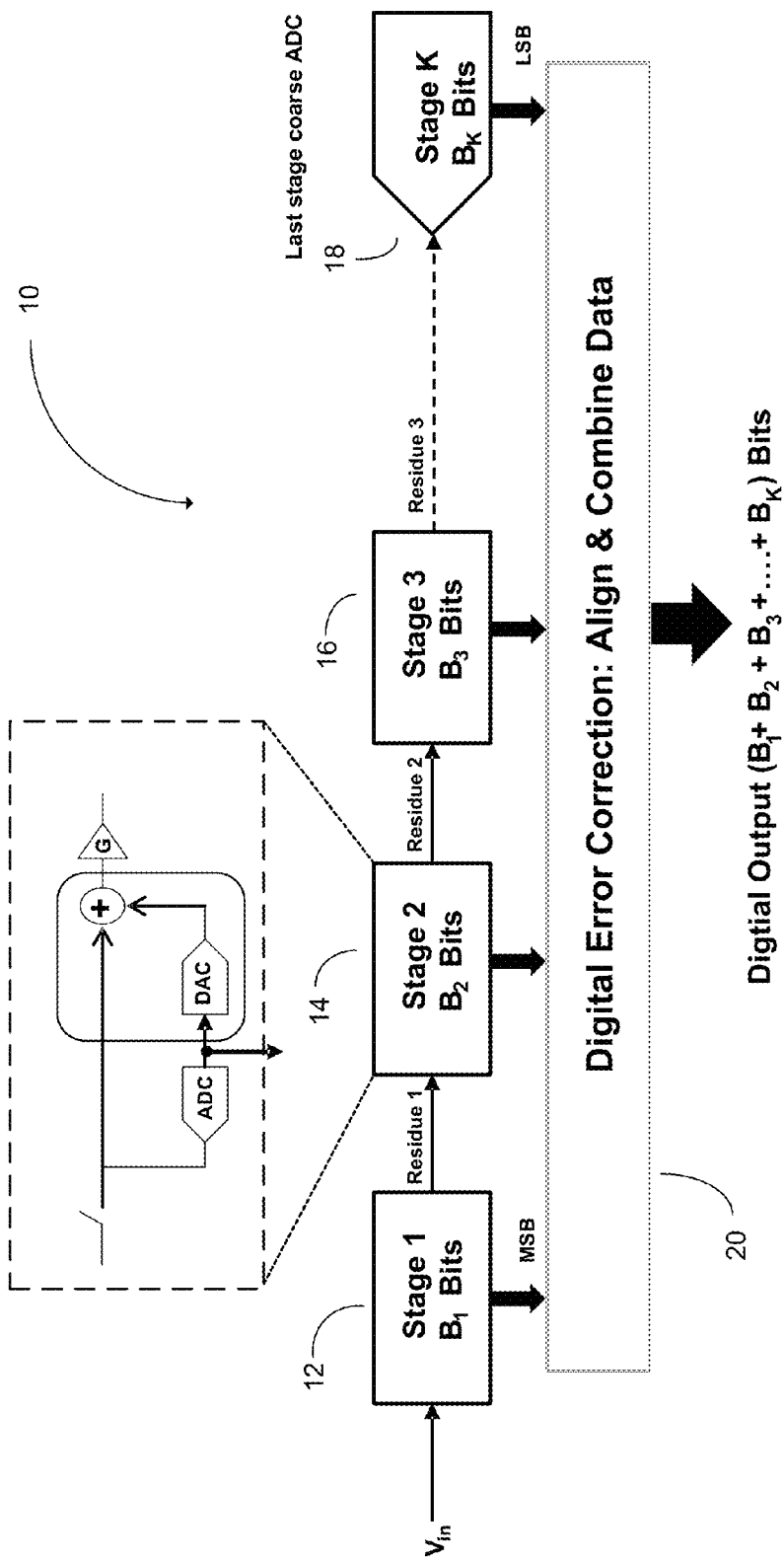
FIG. 1 is a block diagram illustrating an example of a pipeline analog-to-digital converter architecture.

FIG. 1 is a block diagram of a pipeline analog-to-digital converter (ADC) 10 according to one approach. Pipeline ADC 10 may comprise a cascade of a plurality of stages (e.g., 12, 14, 16, and 18). Each stage may be configured to process a number of bits. Pipeline ADC 10 may further comprise digital error correction circuitry 20, for example, a plurality of flip-flops for aligning and combining data.

Figure 2:
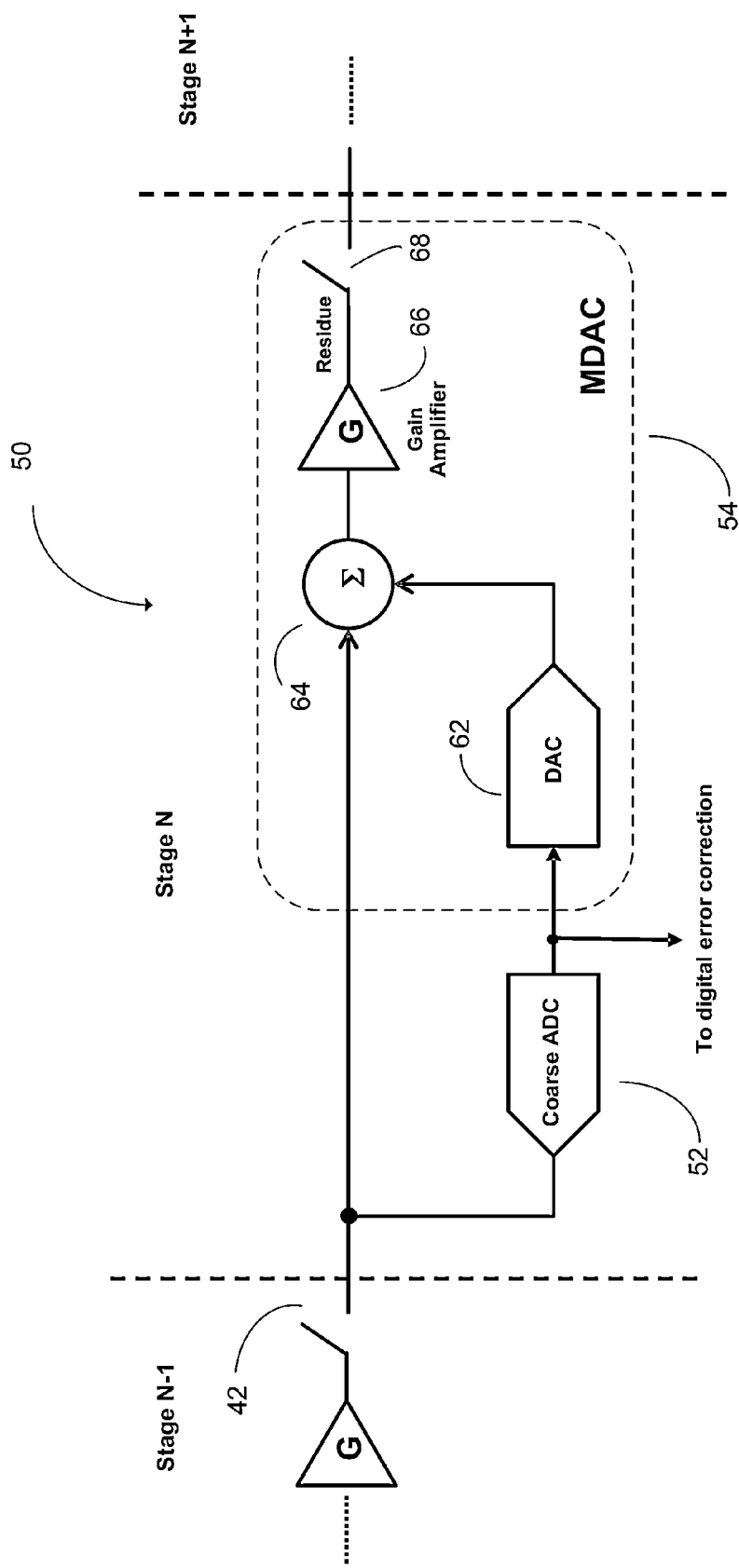
FIG. 2 is a block diagram illustrating an example of a stage of a pipeline analog-to-digital converter.

Referring to FIG. 2, a stage 50 in pipeline ADC 10 in a single-ended implementation is illustrated. Stage 50 may comprise a coarse ADC 52 and a multiplying digital-to-analog converter (MDAC) 54. In some implementations, coarse ADC may comprise a bank of comparators. MDAC 54 may comprise a digital-to-analog convertor (DAC) 62, a summer 64, a gain amplifier 66, and a sample and hold circuit 68. In operation, a sample and hold circuit from a previous stage samples an input signal and coarse ADC 52 may quantize the input signal and provide an digital domain output for the stage. The digital domain output of the input signal may also be provided into DAC 62 to be converted back to an analog domain signal. The analog domain signal may then be provided to summer 64 or difference amplifier. Summer 64 provides a resulting signal from the difference of the input signal and the analog domain signal from DAC 62. The resulting signal may then be provided to gain amplifier 66 in order to obtain a residue voltage, which may then be fed into sample and hold circuit 68. While ADC 10 uses a gain amplifier (e.g., gain amplifier 66) in pipeline stages (e.g., pipeline stage 50), the gain amplifier is omitted in pipeline stages of a pipeline ADC utilizing switchable conductance described in the present disclosure (see, e.g., FIGS. 3 and 5-7).

The residue voltage may be viewed as a representation of the quantization error at the output of the instant gain stage in pipeline ADC 10. By evaluating this quantization error in the next stage of pipeline ADC 10, a digital estimation of the input signal may be refined. With reference to FIG. 1, a last stage 18 of pipeline ADC 10 may comprise coarse ADC 52 without MDAC 54 because further residue voltage processing is not performed.

Pipeline ADCs configured as switched-capacitor implementations, such as, but not limited to, MDAC implementations, utilize high-gain and high-precision operational amplifiers. Switched-capacitor implementations generally require high gain and high precision operational amplifiers. Moreover, in high-speed pipeline ADC applications, the required operational amplifiers may additionally include high bandwidth amplifier characteristics. However, providing high gain, high precision, and/or high bandwidth operational amplifiers in a pipeline ADC architecture utilizing deep submicron technology and fabrication processes is a highly unattractive and challenging design requirement.

For example, high gain operational amplifiers become difficult to implement with deep submicron technology due to headroom issue, such as, but not limited to, the necessity to cascade multiple amplifier stages drawing a significant amount of power and reducing an effective operating bandwidth of a pipeline ADC. Progression toward advanced technology node (e.g., deep submicron fabrication processes) and/or higher resolution applications exacerbate headroom issues whereby high gain operational amplifiers become difficult to implement in view of a trade off in speed and power. Amplifier gain, for instance, is proportional to $2^N$, where N is the number of bits resolved in a given pipeline ADC application. Thus, for high speed and high resolution applications, operational amplifiers having 3 dB gain may present a significant challenge in deep submicron implementations (e.g., a 10-bit pipeline ADC application will generally require a gain of $2^{10}$ or 1024, approximately 100 dB of gain).

Pipeline analog-to-digital conversion devices and methodology, in accordance with aspects of the subject technology, comprise switchable conductance circuitry. In this regard, pipeline ADC implementations and architectures may eliminate, in whole or in part, inter-stage gain functionality requiring high-gain, high-precision, and/or high-bandwidth operational amplifiers. Accordingly, pipeline ADC implementations and architectures may be implemented and optimized utilizing deep submicron technology high speed and high resolution analog-to-digital conversion applications.

In accordance with aspects of the subject technology, one or more implementations of a pipeline ADC may include PMOS (p-channel) transistors and devices, and/or NMOS (n-channel) transistors and devices. However, it is to be appreciated that the subject technology is not limited by a specific transistor technology or architecture, and, therefore, implementations of a pipeline ADC may utilize other field effect transistor (FET) or bipolar junction transistor (BJT) technologies.

In accordance with aspects of the subject technology, a non-overlapping clock scheme may be used. However, it is to be appreciated that a number of various clocking schemes may be utilized with aspects and implementations disclosed herein.

Figure 3:
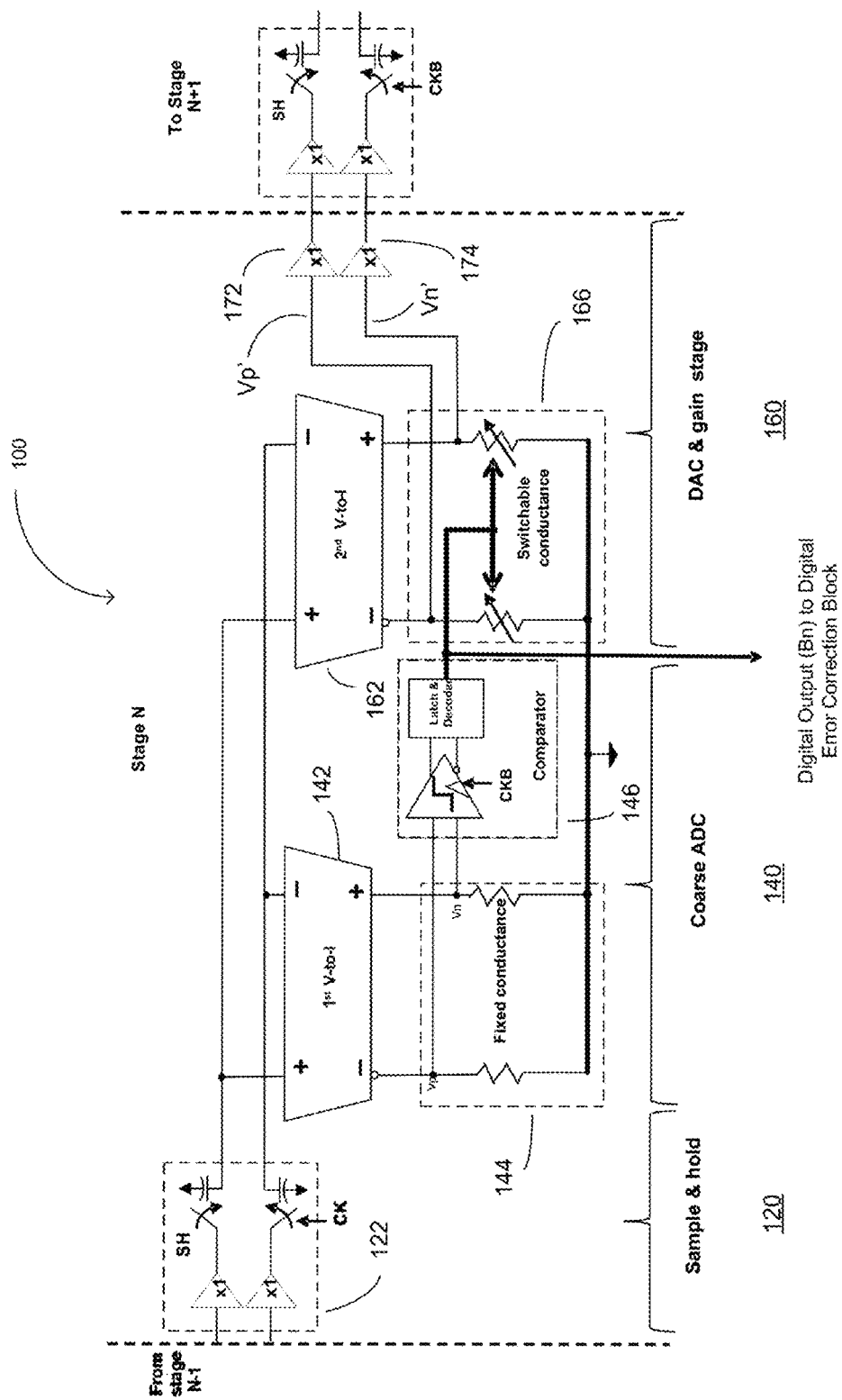
FIG. 3 is a circuit diagram illustrating an example of a stage of a pipeline analog-to-digital converter, in accordance with various aspects of the present disclosure.

FIG. 3 is an example of a stage of a pipeline ADC comprising switchable conductance digital-to-analog conversion circuitry. Pipeline stage 100 may comprise sample and hold (S/H) circuitry 120, analog-to-digital conversion circuitry 140, and switchable conductance digital-to-analog conversion circuitry 160. Analog-to-digital conversion circuitry 140 may include a first voltage-to-current converter 142, fixed conductance circuit 144, and a comparator 146. In some aspects, analog-to-digital conversion circuitry 140 may comprise a coarse analog-to-digital converter, in which first voltage-to-current converter 142 may be loaded with a resistance of the fixed conductance circuit 144, for example, and the comparator 146 may comprise fast comparator components and circuitry. Switchable conductance digital-to-analog conversion circuitry 160 may comprise a second voltage-to-current converter 162 and a switchable conductance digital-to-analog converter (GDAC) 166. It is pertinent to note that switchable conductance digital-to-analog conversion circuitry 160 may include gain stage functionality that would otherwise be provided with other types of pipeline ADCs. S/H circuitry 120 comprises one or more S/H circuits 122. The S/H circuits 122 may be operatively coupled to both analog-to-digital conversion circuitry 140 and switchable conductance digital-to-analog conversion circuitry 160. For example, in operation during a hold phase, the S/H circuits 122 are electrically connected to both the analog-to-digital conversion circuitry 140 and the switchable conductance digital-to-analog conversion circuitry 160.

The one or more S/H circuits 122 may provide an initial positive input voltage (Vp) and an initial negative input voltage (Vn) from the sampled input signal or from a previous stage. The fixed conductance circuit 144 may be operatively coupled to the first voltage-to-current converter 142 and may comprise resistive elements for providing positive input voltage (Vp) and negative input voltage (Vn) for comparison. Comparator 146 makes a determination as to whether Vp or Vn has a larger value. A digital output based on the result of the comparator stage may be provided to digital error correction circuitry. Latch and decoder circuitry may operate to change the effective conductance of the GDAC 166 based on the result.

The switchable GDAC 166 may use current from the second voltage-to-current converter 162 to form voltage. Thus, the conductance properties of the switchable GDAC 166 are pertinent to the operation of the digital-to-analog conversion and gain aspects of the pipeline stage 100. At least for the reason that the pipeline ADC utilizes switched-conductance (e.g., parallelized switched-resistances) digital-to-analog conversion circuitry and functionality in a feed-forward path of each pipeline stage, a design need for a high gain, high speed, and/or high precision operational amplifiers may be eliminated.

Thus, after a switched conductance value is determined based on the output of the comparator 146, a new positive input voltage (Vp') and new negative input voltage (Vn') may be provided by the switchable GDAC 166. The switchable GDAC 166 may be operatively coupled to output buffers 172, 174. In an aspect, output buffers 172, 174 may comprise PMOS-type source followers.

In one aspect, each (N) pipeline stage is configured to resolve or provide a 1-bit output, for example, when the pipeline ADC is used in certain high-speed applications. However, other implementations of the pipeline ADC may resolve or provide multiple bits per pipeline stage.

In accordance with an aspect, there are no external reference voltages utilized in pipeline ADC stages. After successive pipeline stages the residue voltage may converge to zero. In other words, the measured error may become smaller and smaller with each pipeline stage. The balancing of the voltages on the positive and negative side (e.g., Vp and Vn) may be performed to achieve convergence. In this regard, data conversion circuitry is self-referencing and, therefore, there is no need for any external reference voltages in accordance with certain implementations. It is contemplated, however, that in some implementations of the subject technology, that a reference voltage may be used. For example, a reference voltage may be used in some implementations where 1.5-bits are resolved in each pipeline stage.

Figure 4:
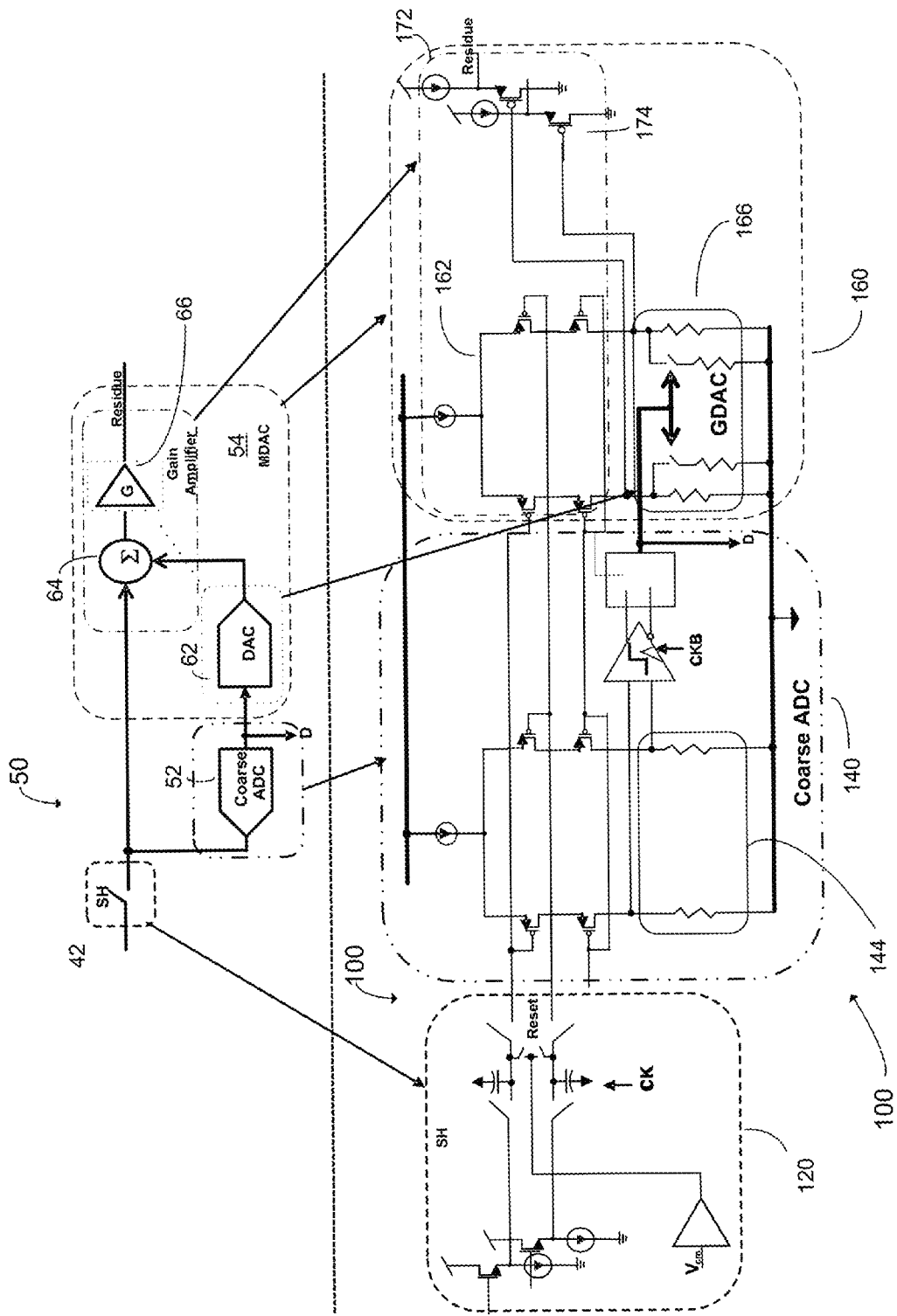
FIG. 4 are circuit diagrams illustrating analogous aspects of the pipeline analog-to-digital converter architecture described in FIGS. 1 and 2 with the pipeline analog-to-digital converter illustrated in FIG. 3, in accordance with various aspects of the present disclosure.

Now referring to FIG. 4, illustrates a comparison between aspects of pipeline stage 50 (described and illustrated, e.g., in FIGS. 1 and 2) and aspects of pipeline stage 100 (certain aspects of which are described and illustrated, e.g., in FIG. 3). Sample and hold circuit 42, which is from a previous (N−1) pipeline stage prior to pipeline stage 50 (see, e.g., FIG. 2) or in some instances from a same pipeline stage (see, e.g., reference number 14 in FIG. 1), may be provided in S/H circuitry 120 of pipeline stage 100 (see, e.g., FIG. 3). Functionality of coarse ADC 52 of pipeline stage 50 (see, e.g., FIG. 2) may be provided in analog-to-digital circuitry 140 of pipeline stage 100 (see, e.g., FIG. 3). Functionality of MDAC 54 and gain amplifier 66 of pipeline stage 50 (see, e.g., FIG. 2) may be provided in switchable GDAC 166 of pipeline stage 100 (see, e.g., FIG. 3). Functionality of summer 64 of pipeline stage 50 (see, e.g., FIG. 2) may be provided in second voltage-to-current converter 162 and output buffers 172, 174 of pipeline stage 100 (see, e.g., FIG. 3).

Figure 5:
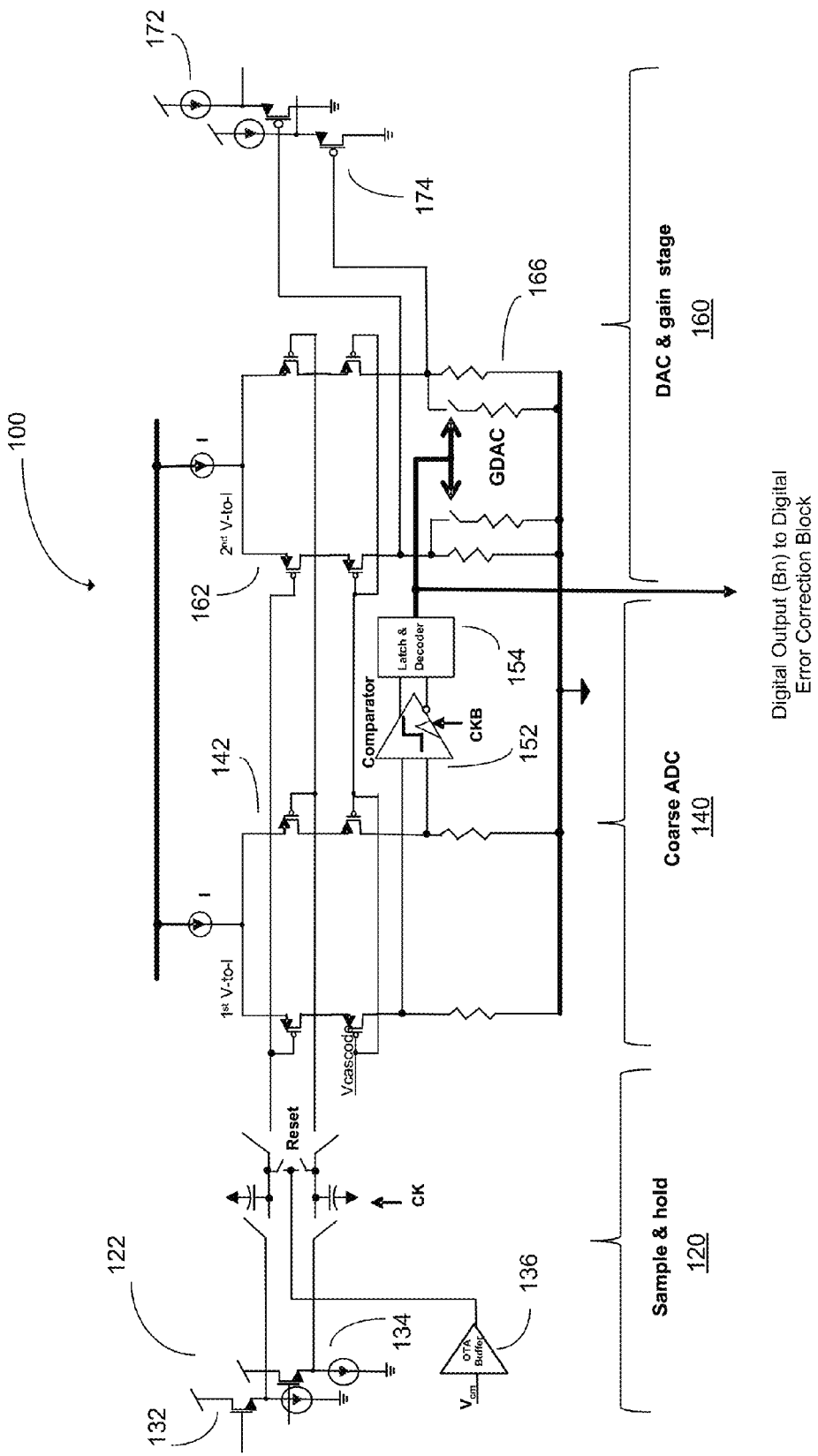
FIG. 5 is a circuit diagram illustrating an example of a stage of a pipeline analog-to-digital converter, in accordance with various aspects of the present disclosure.

FIG. 5 provides additional circuit details with respect to exemplary pipeline stage 100 described above and shown in FIG. 3. For example, S/H circuitry 120 may comprise buffer circuit 136. Buffer circuit 136 may comprise a unity-gain feedback amplifier, which may aid in preventing noise from going back into a common mode voltage reference. In one exemplary implementation, buffer circuit 136 may comprise an operational transconductance amplifier (OTA). S/H circuits 122 may comprise input buffers 132, 134. Input buffers 132, 134 may comprise NMOS-type source followers. Comparator 146 may comprise comparator circuit 152 and latch and decoder logic circuitry 154 for switching the conductance values of the switchable GDAC 166 based on the result of the comparator circuit 152.

Additionally, in some implementations, the first voltage-to-current converter 142 may provide some amplification of Vp and Vn (e.g., a gain of two) so that comparator 146 may operate effectively, and the voltage gain of the second voltage-to-current converter 162 coupled with the switchable conductance 166 may be very close to one (e.g., unity gain). Moreover, a same current value may be provided through both voltage-to-current converters 142, 162.

The first conductance stage incorporating the first voltage-to-current converter 142 is fixed (e.g., fixed conductance circuit 144). In this regard, the common mode level at the first voltage-to-current converter 142 may be given as 0.5(Vp+Vn). In other words the average of Vp and Vn may be used to set the common mode level. The first conductance stage's Vp and Vn may be determined by the current being steered through the first voltage-to-current converter 142 into the fixed conductance circuit 144. The amount of current may be set by the sampled input voltage and the transconductance ($g_m$) of the first voltage-to-current converter 142 in accordance with certain implementations.

The second conductance stage incorporating the second voltage-to-current converter 162 is variable (e.g., switchable GDAC 166). However, it is to be appreciated that certain implementations of the switchable GDAC 166 comprise both fixed conductance and switchable conductance components. For example, in some configurations, switchable conductance components may be switched based on the determination of the comparator in relation to the values Vp or Vn, which are output voltages of the first conductance stage incorporating the first voltage-to-current converter 142. Certain fixed components of the switchable GDAC 166 in the second conductance stage may never switch.

It is to be understood that according to certain aspects, switching functions to add resistors in parallel to the switchable GDAC 166 can lead to a higher conductance, and switching functions to remove resistors in parallel configuration from the switchable GDAC 166 can lead to a lower conductance. Moreover, the common mode level at the an output of the second conductance stage incorporating the second voltage-to-current converter 162 may be given as 0.5(Vp'+Vn'). In other words, the average of Vp' and Vn' may set the common mode level of the second conductance stage. The second conductance stage's Vp' and Vn' may be determined by the current being steered through the second voltage-to-current converter 162 into the switchable GDAC 166. The amount of current may be set by the sampled input voltage and the transconductance ($g_m$) of the second voltage-to-current converter 162. At the end of each conversion cycle, the second conductance stage, which is switchable utilizing the switchable GDAC 166, may be reset to its initial value, and may be equal to the conductance value of the first conductance stage in accordance with certain implementation. For example, this resetting operation of the switchable GDAC 166 may be achieved by resetting one or more registers of the comparator circuit 152 and/or latch and decoder logic circuitry 154 to their initial value.

The relationship between full scale voltage and common mode voltage of the voltage-to-current converters in accordance with certain aspects is described. It is to be appreciated that the common mode voltage must be carefully chosen such that the inputs to the comparator 146 are biased correctly. In certain implementations, a binary search and algorithm may be used (e.g., in a similar manner to a successive approximation register analog-to-digital converter (SAR ADC)), the first conductance stage may determine the full scale value. Thus, the relationship between the full scale swing as determined at the output of the first voltage-to-current converter 142 and the common mode of the voltage-to-current converter may be given as:

$$V_{FS} = \frac{4}{3} V_{CM} = V_{ref} \quad \text{(Eq. 1)}$$

In Eq. 1, the '4' in the numerator value denotes the peak-to-peak swing, and the '3' in the denominator value denotes the ratio of the common mode voltage to the full scale voltage. In other words, the swing is to be kept to be a third of the common mode voltage in accordance with some implementations.

Figure 6:
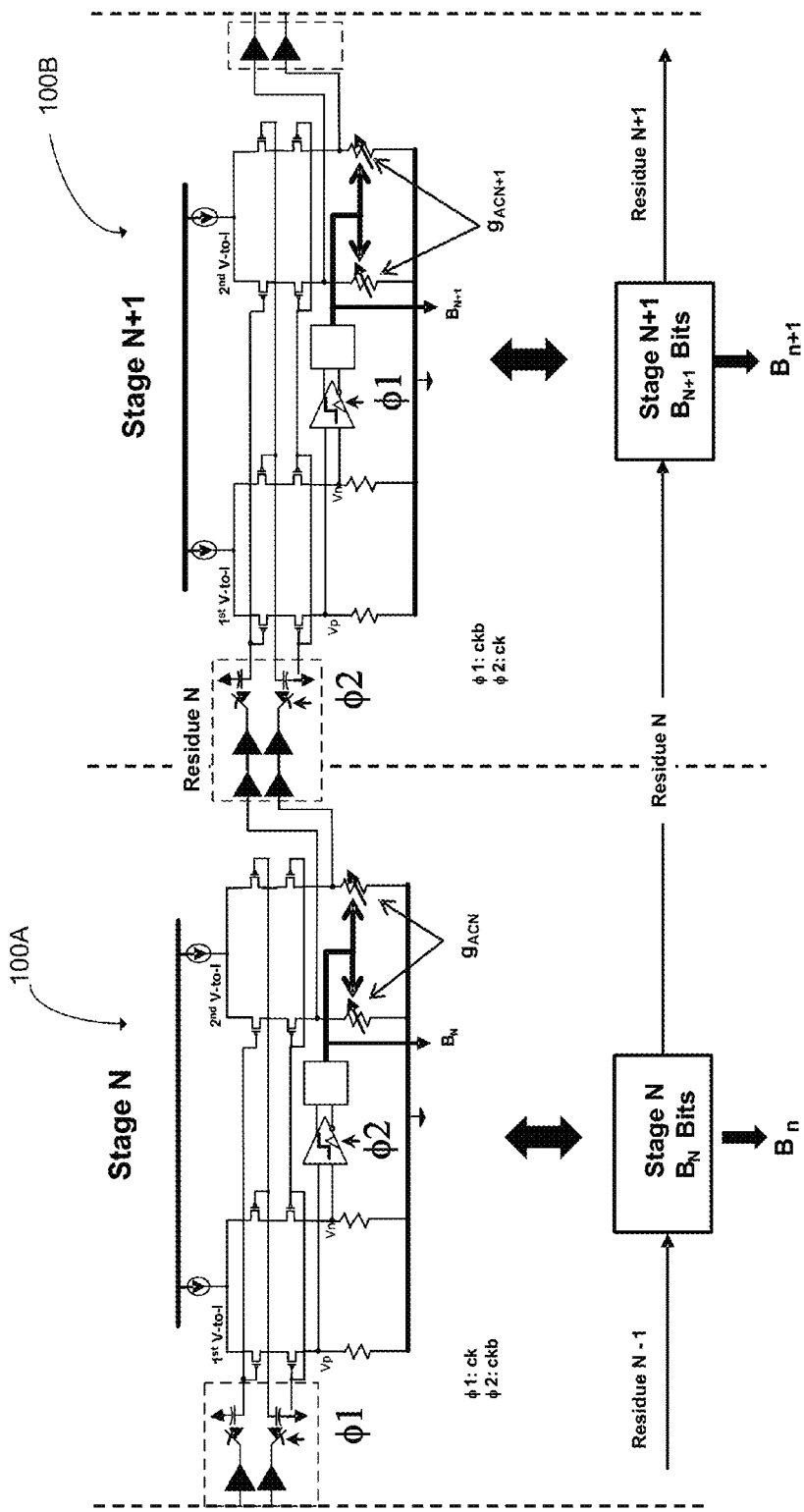
FIG. 6 is a circuit diagram illustrating an example of adjacent stages of a pipeline analog-to-digital converter, in accordance with various aspects of the present disclosure.

FIG. 6 illustrates an example of adjacent stages of a pipeline ADC. Pipeline stage (N) 100A receives residue voltage from a preceding pipeline stage (N−1). Pipeline stage (N) 100A process Vp and Vn, and provides digital output Bn for the stage. Pipeline stage (N) 100A provides residue voltage (N) to a next adjacent stage, pipeline stage (N+1) 100B. Pipeline stage (N+1) 100B process Vp and Vn, and provides digital output Bn+1 for the stage. Pipeline stage (N+1) 100B provides residue voltage (N+1) to a next adjacent stage. It is understood that a multiple of stages may be cascaded, as described herein, in view of the number of bits associated with a particular pipeline ADC implementation.

Figure 7:
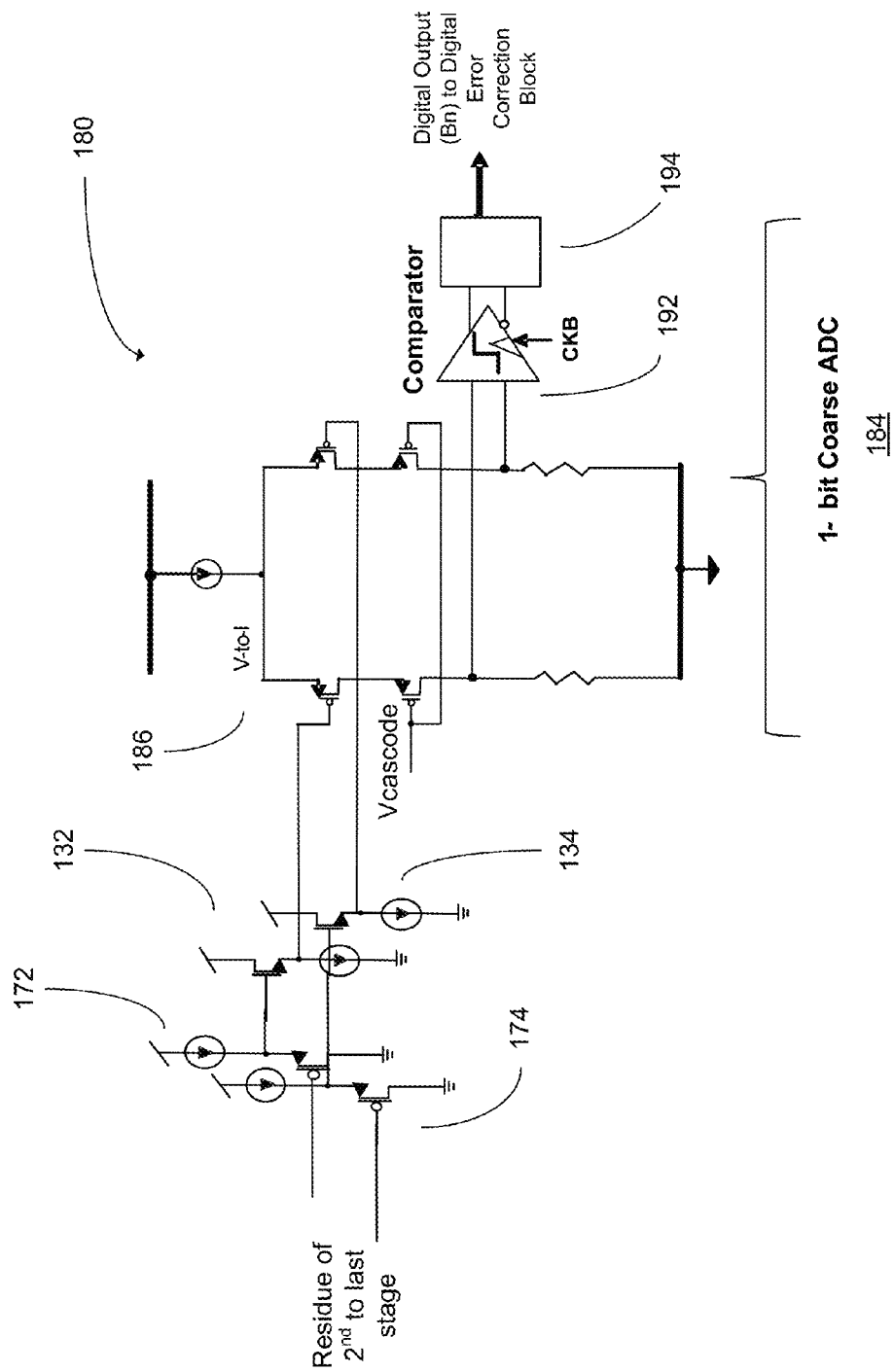
FIG. 7 is a circuit diagram illustrating an example of the last stage of a pipeline analog-to-digital converter, in accordance with various aspects of the present disclosure.

FIG. 7 is a circuit diagram illustrating an example of an end stage of a pipeline ADC. In accordance with certain aspects, an end-stage analog-to-digital conversion circuit 180 may comprise input buffers 132, 134, and a 1-bit coarse flash analog-to-digital converter 184. End-stage analog-to-digital conversion circuit 180 receives residue voltage of a second to last stage in a pipeline analog-to-digital converter configuration. The 1-bit coarse flash analog-to-digital converter 184 may comprise a voltage-to-current converter 186 operatively coupled to a comparator comprising a comparator circuit 192 and latch and decoder circuitry 194. The comparator may provide a digital domain output for the last stage, for example, a 1-bit output being the least significant bit in the analog-to-digital conversion process.

As described above, in some implementations, an end-stage analog-to-digital conversion circuit may comprises an n-bit coarse flash analog-to-digital conversion circuit, such as, but not limited to, a 1-bit coarse flash analog-to-digital converter. However, it is understood that certain implementations of the last stage analog-to-digital conversion circuit may include, for example, a 3-bit coarse flash analog-to-digital converter or other n-bit analog-to-digital conversion technologies.

Figure 8A:
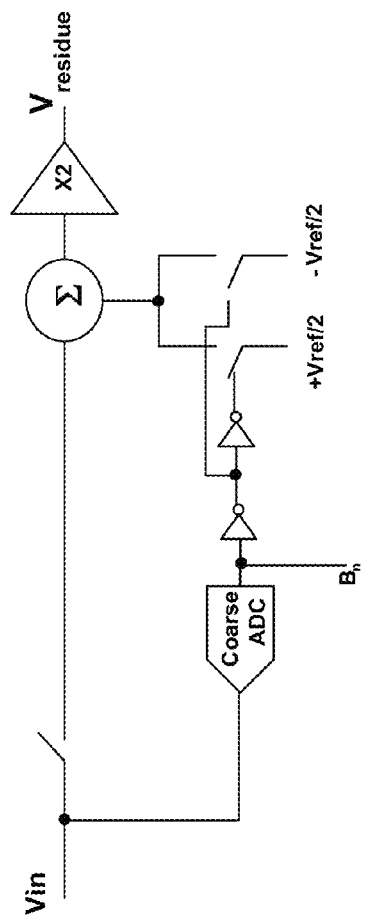
FIGS. 8A and 8B are circuit diagrams illustrating examples of stages of pipeline analog-to-digital converters, in accordance with various aspects of the present disclosure.
Figure 8B:
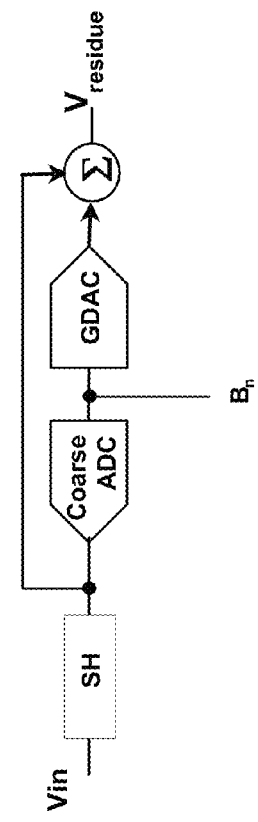

FIGS. 8A and 8B are circuit diagrams illustrating examples of stages of pipeline analog-to-digital converters. The residue voltage transfer functions of a pipeline ADC (e.g., pipeline ADC 10 having stages 12, 14, and 16 from FIG. 1 or stage 50 from FIG. 2) and a pipeline ADC utilizing switchable conductance (e.g., a pipeline ADC having exemplary pipeline stages 100 from FIGS. 3-6) are shown for comparison. The transfer function associated with a stage (e.g., stages 12, 14, or 16 in FIG. 1, or stage 50 in FIG. 2) of a pipeline ADC (e.g., pipeline ADC 10 in FIG. 1) and diagramed in FIG. 8A may be expressed by the following equation:

$$V_{residue} = 2(V_{in} - ([B_n]V_{ref})),$$

where $$B_n = 1 \text{ or } -1, \text{ and } n = 0, 1, 2, \ldots, K-1 \quad \text{(Eq. 2)}$$

By comparison, the transfer function associated with an exemplary stage of a pipeline ADC utilizing switchable conductance (e.g., a pipeline ADC having exemplary pipeline stages 100 in FIGS. 3-6) and diagramed in FIG. 8B may be expressed by the following equation:

$$\frac{1}{V_{residue}} = \left(\frac{1}{g_m V_{in}}\right)((g_{o1n}) + ([B_n]g_{o2n})),$$

where $$B_n = 1 \text{ or } -1, \text{ and } n = 0, 1, 2, \ldots, K-1 \quad \text{(Eq. 3)}$$

Figure 9:
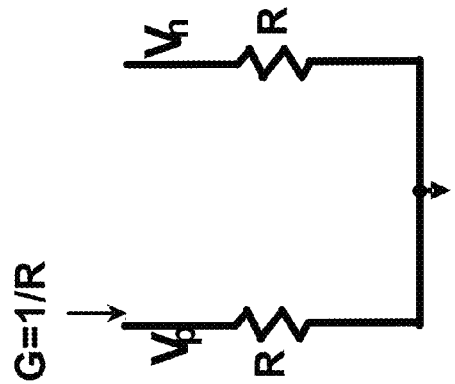
FIG. 9 is a circuit diagram illustrating an example of a portion of a stage of a pipeline analog-to-digital converter, in accordance with various aspects of the present disclosure.

FIG. 9 illustrates an example of a fixed conductance circuit for a pipeline stage (see, e.g., FIG. 3, fixed conductance circuit 144). In certain implementations, resistance value R utilized in the exemplary fixed conductance circuit may be selected based on the resistance values R1 and R2 utilized in the switchable digital-to-analog conversion circuitry. For example, the resistance value R may be selected base on the following equation:

$$R = \frac{R1 \cdot R2}{(R1 + R2)} \quad \text{(Eq. 4)}$$

Figure 10:
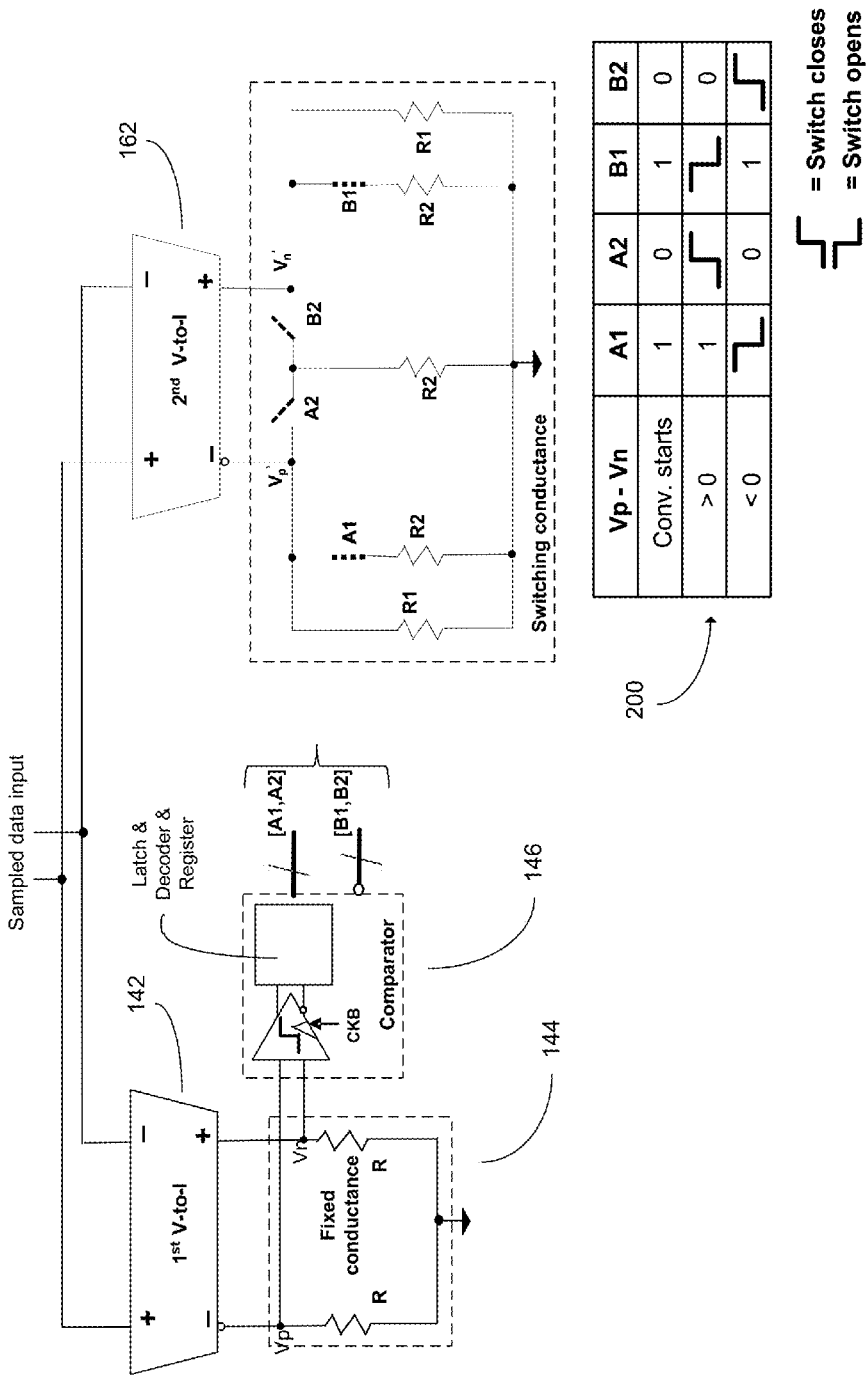
FIG. 10 is a circuit diagram and chart illustrating an example of a stage of a pipeline analog-to-digital converter, in accordance with various aspects of the present disclosure.

FIG. 10 is a circuit diagram and chart illustrating an example of a stage of a pipeline analog-to-digital converter, showing certain aspects of the switchable conductance digital-to-analog conversion circuitry. In accordance with certain aspects, comparator 146 provides switching decisions for switches A1, A2, B1, and B2 in the switchable GDAC 166.

For example, in certain implementations and configurations, switches A1 and B1 are in a closed position, while A2 and B2 are in an opened position. A comparison of Vp and Vn based on the first voltage-to-current converter 142 and fixed conductance circuit 144 is made to produces digital data [A1,A2] and [B1,B2]. The digital data controls the switch conductance settings of the second voltage-to-current converter 162. Current is used from second voltage-to-current converter 162 to form a voltage, so the conductance aspects of the plurality of resistors are configured to be switched in the switchable GDAC 166. Switchable GDAC 166 may comprise both resistive components that are fixed and other resistive components that are switchable. As shown in the example illustrated in FIG. 10, switchable GDAC 166 comprises a parallel arrangement of two resistors of value R1 and three resistors of value R2 and switches A1, A2, B1, B2 as illustrated in FIG. 10. Moreover, the resistive components included in the switchable GDAC 166 include a relationship to the resistive components of fixed conductance circuit 144 in the analog-to-digital conversion circuitry as described above with respect to FIG. 9. In such implementations and configurations, [A1,A2] is the complement of [B1,B2], and at the end of each conversion cycle the switches are reset to an initial setting, whereby switches A1 and B1 are in a closed position and switches A2 and B2 are in an opened position. Chart 200 illustrates switching decision logic in accordance with certain implementations and configurations. In certain aspects, one or more switches (e.g., A1, A2, B1, and B2) may comprise one or more PMOS (p-channel) transistors, one or more NMOS (n-channel) transistors, or one or more pass gate switches comprising both PMOS and NMOS (complementary MOS or CMOS) transistors.

It is understood that other implementations and configurations regarding various aspects related to the switchable conductance digital-to-analog conversion circuitry are contemplated as would be appreciated by those of skill in the art given the benefit of the present disclosure.

Figure 11:
FIG. 11 is a chart illustrating an example of switch conductance values for a plurality of stages of a pipeline analog-to-digital converter, in accordance with various aspects of the present disclosure.

FIG. 11 is a chart illustrating an example of switch conductance values for a plurality of stages of a pipeline analog-to-digital converter. In accordance with certain implementations and configurations aspects, chart 300 describes the switching resistance/conductance relationship in stages of an exemplary 8-bit pipeline ADC. As shown in the example of chart 300, the switched conductance G2 values should decrease (and resistor R2 values increase) in a binary fashion as pipeline stages cascade from most significant bit (MSB) at the first pipeline stage, to the least significant bit (LSB) at the last or end stage.

Moreover, in certain implementations and configurations, resistances R1 and R2 as provided in the example of chart 300, may be comprised of unit resistors having a 750Ω value. For example, resistances R2 of the various stages may comprise a series configuration of 750Ω unit resistors. For example, R2 of stage 1 may comprise two 750Ω unit resistors in series; R2 of stage 2 may comprise four 750Ω unit resistors in series; R2 of stage 3 may comprise eight 750Ω unit resistors in series, etc. (i.e., increasing the number of unit resistors in series by 2"×750Ω in each subsequent stage). Additionally, resistances R1 of the various stages may be comprised of a parallel combination of R1 of the previous (N−1) stage and R2 of the present (N) stage. For example, R1 of stage 3 may comprise the parallel combination of stage 2's R1 value and stage 3's R2 value; R1 of stage 4 may comprise the parallel combination of stage 3's R1 value and stage 4's R2 value; R1 of stage 5 may comprise the parallel combination of stage 4's R1 value and stage 5's R2 value, etc.

Figure 12:
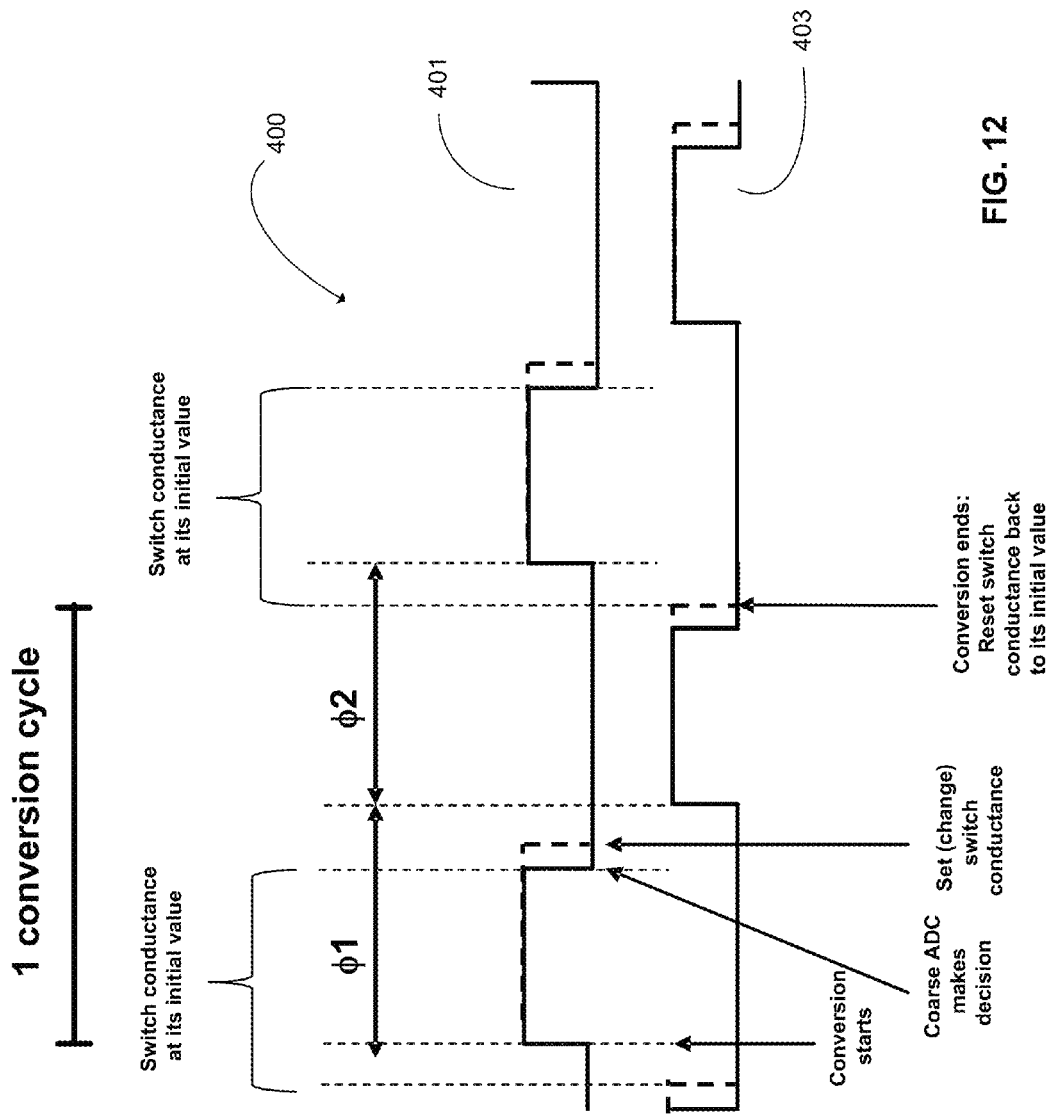
FIG. 12 is a diagram illustrating examples of clocking signals, in accordance with various aspects of the present disclosure.

FIG. 12 is a diagram illustrating examples of clocking signals. In some aspects, clocking circuitry may be configured to provide clocking signals 401, 403 as shown in timing diagram 400. Clocking signals 401, 403 and the phases thereof may be utilized in the operation of various switching conductance aspects. In accordance with certain aspects, clocking signals 401, 403 and associated timing circuitry may define a conversion cycle for the timing of certain functions associated with the switchable GDAC 166 of a pipeline ADC. For example, with reference to the examples provided in FIGS. 3 and 12, the conversion cycle may define: a time during which the switchable conductance of the switchable GDAC 166 remains at its initial value; a time when the analog-to-digital conversion circuitry 140 (for example, a coarse analog-to-digital converter) makes a decision regarding the comparison of Vp and Vn; a time for setting or changing a value of the switchable conductance of the switchable GDAC 166; and a time for resetting the switchable conductance of switchable GDAC 166 back to its initial value.

Figure 13B:
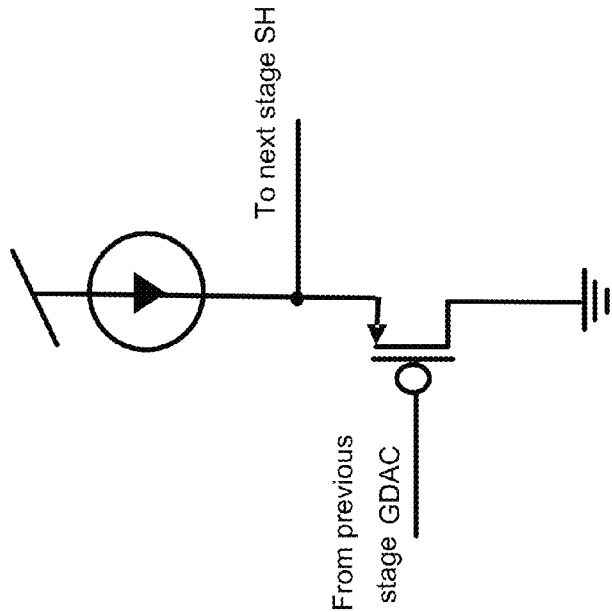
FIGS. 13A and 13B are circuit diagrams illustrating examples of source follower circuits utilized in one or more stages of a pipeline analog-to-digital converter, in accordance with various aspects of the present disclosure.
Figure 13A:
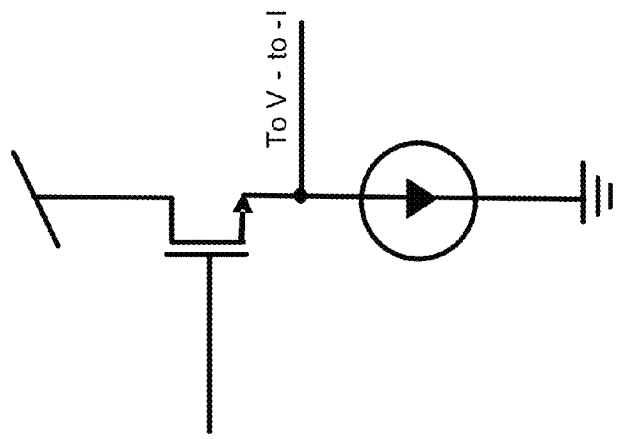

FIGS. 13A and 13B are circuit diagrams illustrating examples of source follower circuits that may be utilized in one or more stages of a pipeline ADC. As mentioned above, certain input buffers may comprise NMOS-type source followers as illustrated in FIG. 13A, and certain output buffers may comprise PMOS-type source followers as illustrated in FIG. 13B.

Figure 14:
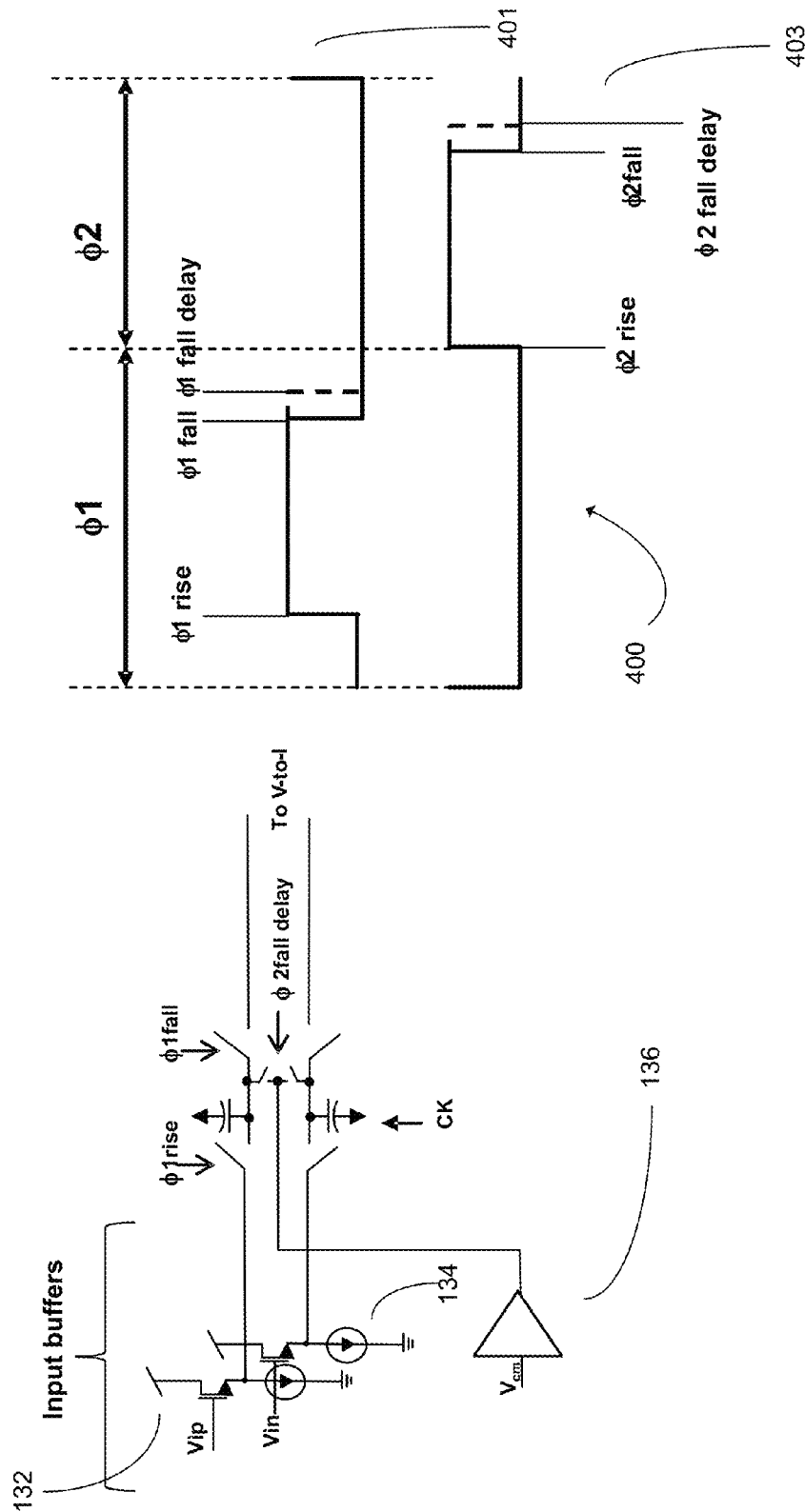
FIG. 14 illustrates a circuit and clocking diagram of an example of a sample and hold circuit with examples of clocking signals, in accordance with various aspects of the present disclosure.

FIG. 14 illustrates a circuit and timing diagram of an example of a sample and hold circuit with examples of clocking signals that may be utilized in one or more stages of a pipeline ADC. Timing diagram 400 provides exemplary clocking signals 401, 403. In accordance with certain aspects, sample and hold circuit switching features are illustrated with respect to the phases of clocking signals 401, 403 shown in timing diagram 400.

Figure 15:
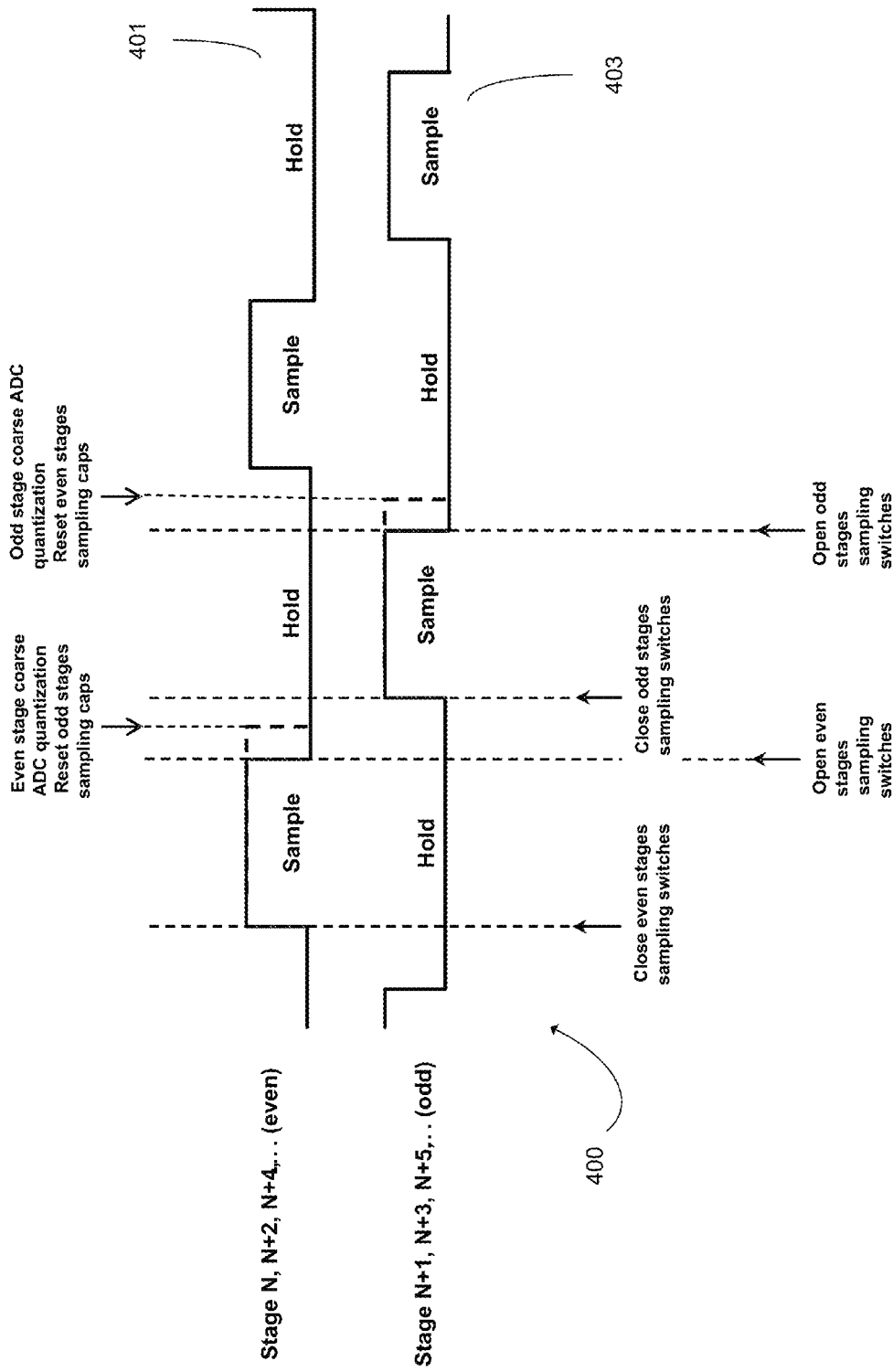
FIG. 15 is a timing diagram illustrating examples of clocking signals, in accordance with various aspects of the present disclosure.

FIG. 15 is timing diagram illustrating examples of clocking signals for executing certain sample and hold functions with respect to the stages of a pipeline ADC. According to certain implementations, even-numbered pipeline stages may be performing sample functions, while odd-numbered pipeline stages may be performing hold functions as illustrated and described in timing diagram 400 having clocking signals 401, 403.

Figure 16:
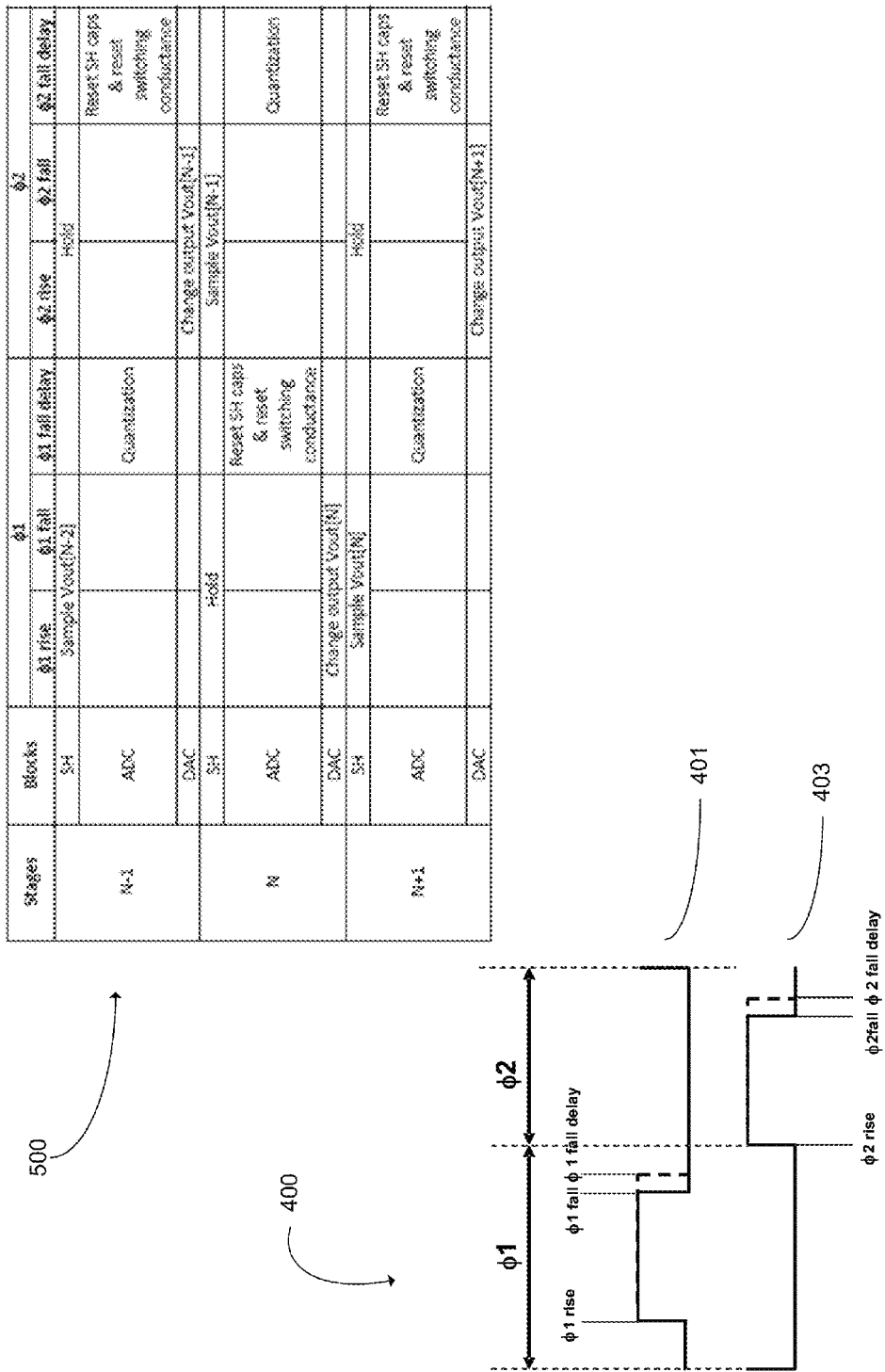
FIG. 16 is a timing diagram and chart illustrating an example of timing aspects of various stages of a pipeline analog-to-digital converter with examples of clocking signals, in accordance with various aspects of the present disclosure.
Figure 17:
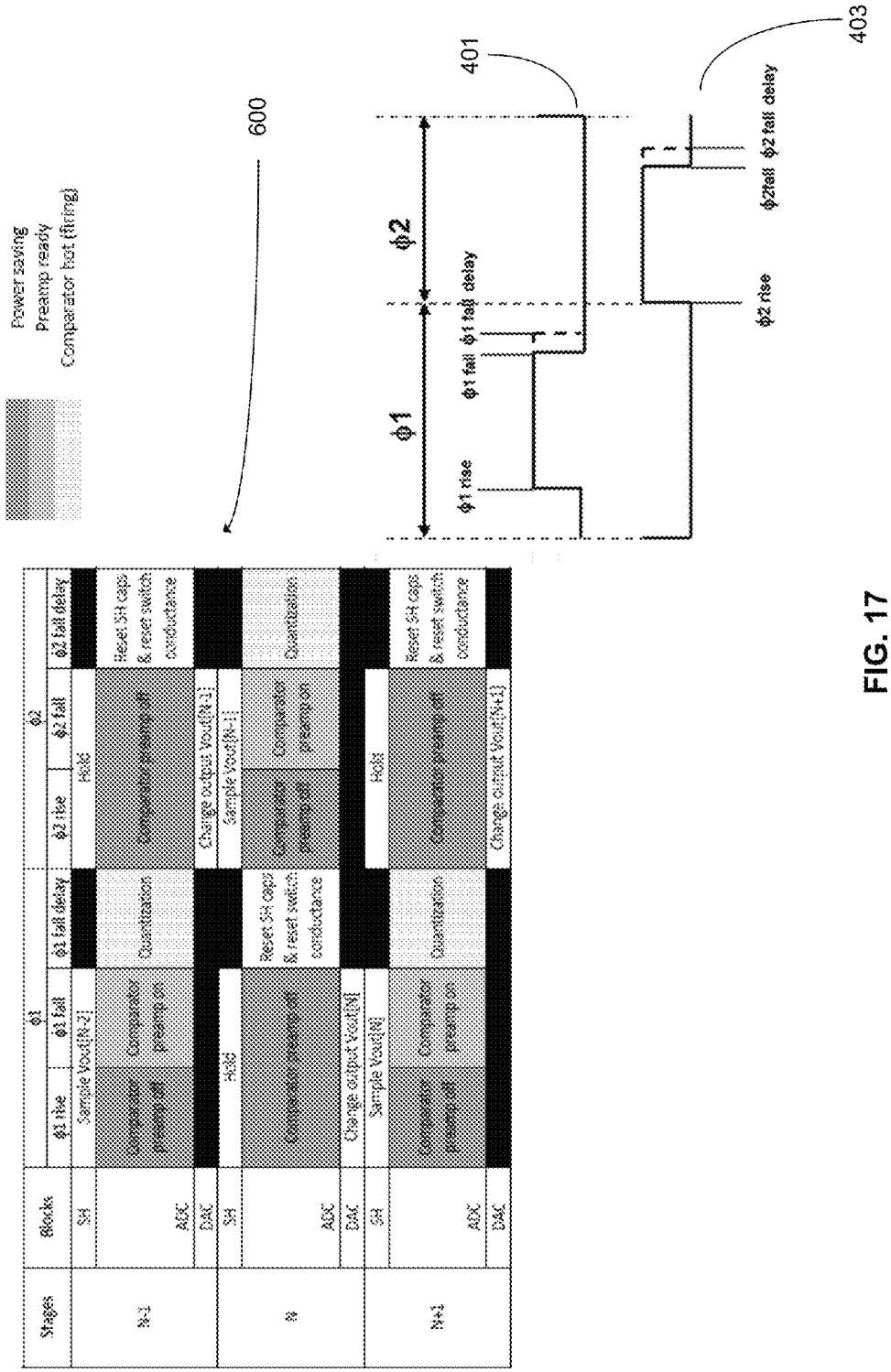
FIG. 17 is a timing diagram and chart illustrating an example of power and timing aspects of various circuits of stages of a pipeline analog-to-digital converters with examples of clocking signals for a power saving mode, in accordance with various aspects of the present disclosure.

FIGS. 16 and 17 include charts illustrating examples of timing aspects of various circuits of stages of a pipeline ADC with examples of associated clocking signals. Chart 500 describes various operations performed between adjacent pipeline stages with reference various phases of clocking signals 401, 403 shown in timing diagram 400. Chart 600 also describes various operations performed between adjacent pipeline stages with reference to various phases of clocking signals 401, 403 shown in timing diagram 400, but further describes power saving mode operations in accordance with certain aspects.

As shown in timing diagram 400, clocking signal 401 may include a first phase rise time segment, a first phase fall time segment, and first phase fall-delay time segment. Clocking signal 403 may include a second phase rise time segment, a second phase fall time segment, and a second phase fall-delay time segment. In accordance with certain aspects, clocking signals 401, 403 and associated circuitry may be configured such that a comparator preamp bias current can be reduced down to a trickle current during a power saving mode.

With reference to the examples provided in FIGS. 3 and 17, a preamplifier of comparator 146 in an (N) stage may be off during the first phase rise time segment and the first phase fall time segment. The preamplifier of the comparator 146 in the (N) stage may be off during the second phase rise time segment and may be active during the second phase fall time segment. Additionally, a preamplifier of the comparator 146 in an (N+1) stage may be off during the first phase rise time segment and may be active during the first phase fall time segment. The preamplifier of the comparator 146 in the (N+1) stage may be off during the second phase rise time segment and the second phase fall time. In this regard, the comparator circuitry may be kept somewhat 'alive' so that it can be turned on or activated quickly during an active or 'on' phase.

Additional operational aspects of a pipeline ADC are described in chart 500 of FIG. 16 and chart 600 of FIG. 17, depicting the interplay between three adjacent pipeline stages. For example, the comparator 146 in an (N) stage may be configured to reset the switchable conductance digital-to-analog conversion circuit to an initial conductance value configuration during the first phase fall-delay time segment, and the analog-to-digital conversion circuitry 140 may be configured to operate in a quantization phase for producing the n-bit digital domain output during the second phase fall-delay time segment of the second clocking signal. It is noted that Vout [N−2] denotes an output of previous pipeline stage (N−2). In other words, the output of pipeline stage (N−2) would become the input of pipeline stage (N−1).

Figure 18:
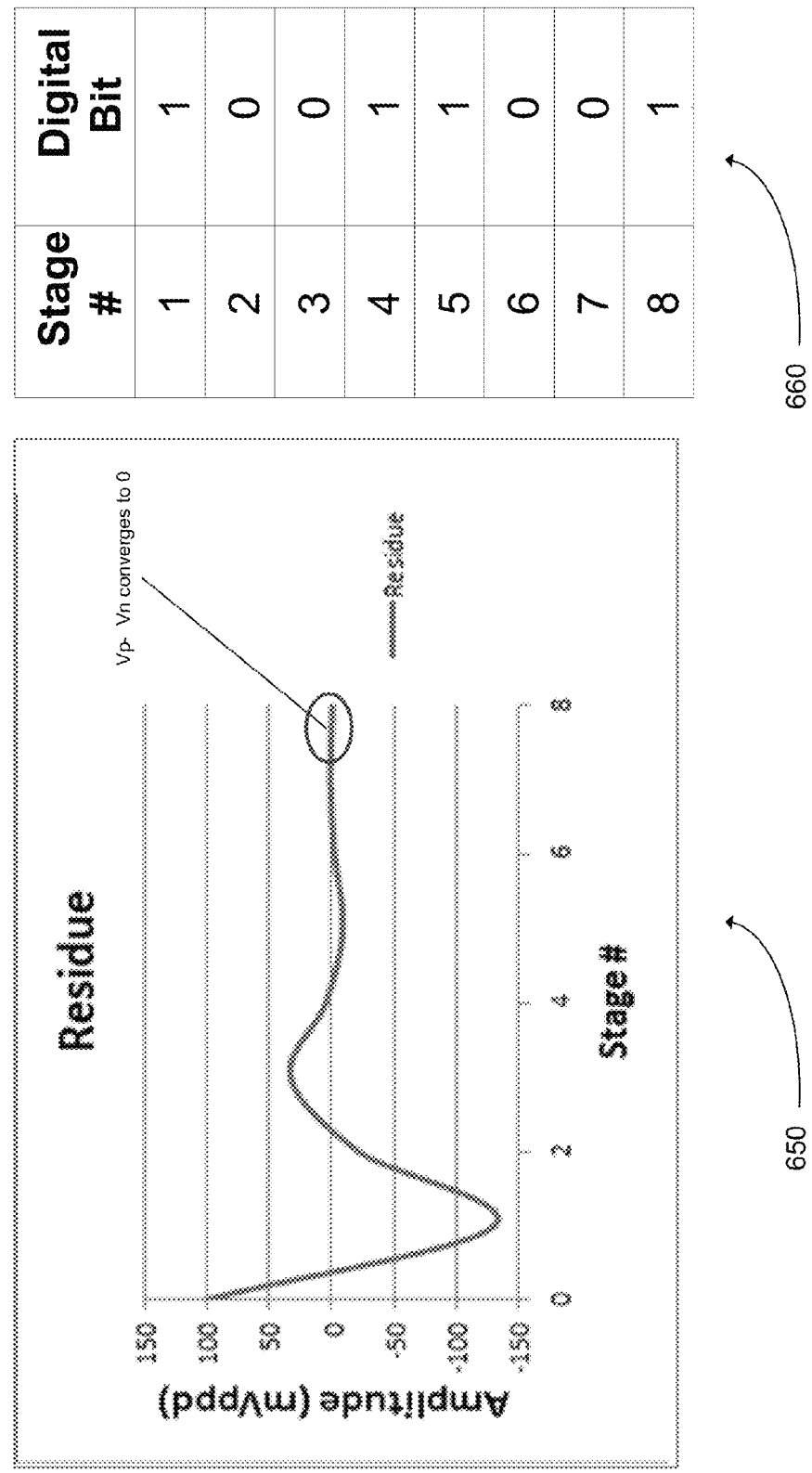
FIG. 18 is a diagram and table illustrating a residue voltage signal and a digital bit output of an example of a pipeline analog-to-digital converter, in accordance with various aspects of the present disclosure.

FIG. 18 is a diagram illustrating a residue voltage signal and digital bit output for an example of a pipeline ADC. Diagram 650 shows residue voltage through a cascade of pipeline stages for an example of a pipeline ADC implementation having an eight-bit output and eight pipeline stages. In the exemplary pipeline ADC implementation having residue voltage described in diagram 650, a common mode voltage Vcm may equal 330 mV, and the reference voltage Vref may equal 440 mVppd. Table 660 provides a digital bit output of the exemplary pipeline ADC implementation. Diagram 650 displays an aspect of the subject technology in which Vp-Vn converges to zero.

Figure 19:
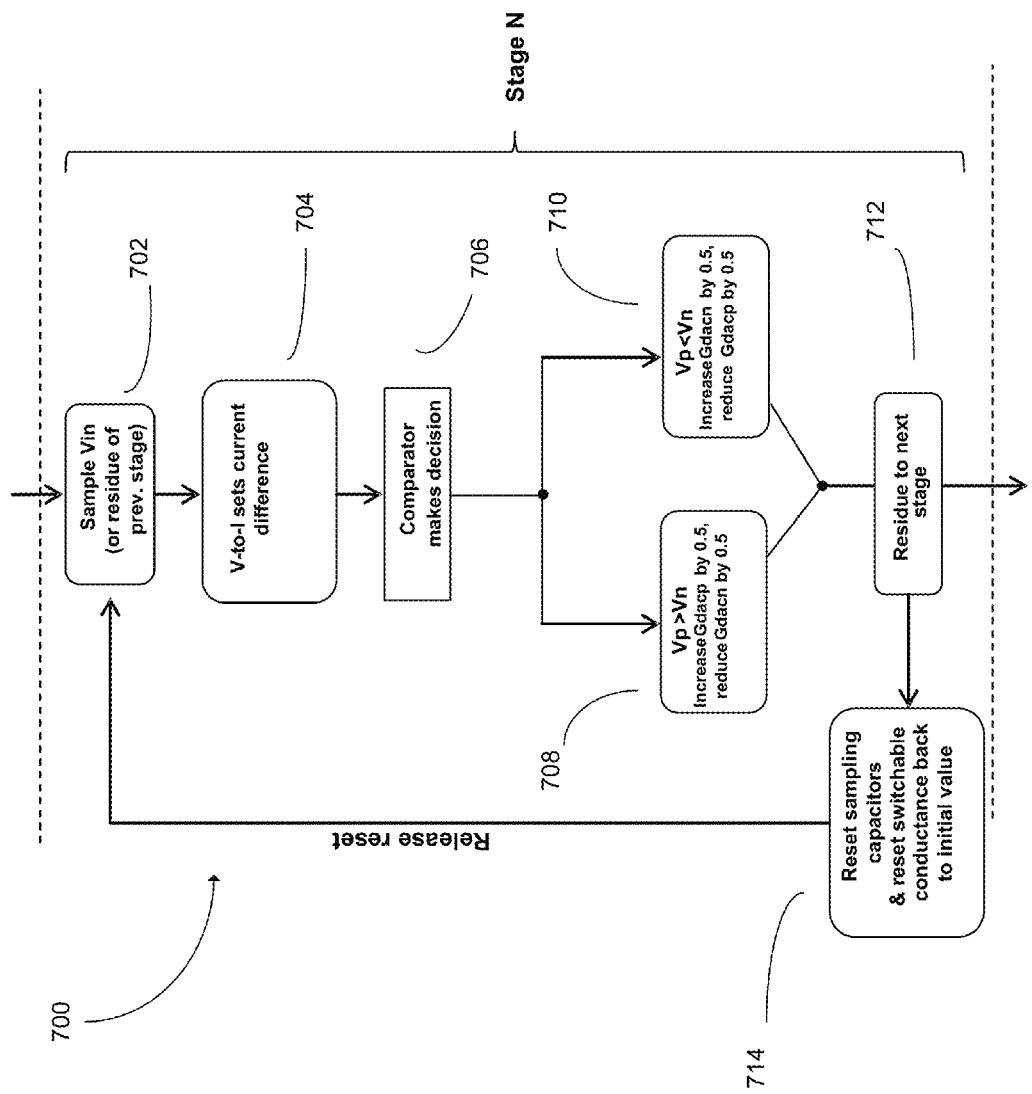
FIG. 19 is a flow chart illustrating an example of a method of analog-to-digital conversion, in accordance with various aspects of the present disclosure.

FIG. 19 is a flow chart illustrating an example of a method of analog-to-digital conversion. Method 700 relates to analog-to-digital conversion in a pipeline configuration. At operation 702, an input voltage Vin (or residue voltage from a previous stage) may be sampled. At operation 704, a current difference may be set with, for example, first voltage-to-current converter in an (N) pipeline analog-to-digital converter stage, to produce a first positive input voltage (Vp) and a first negative input voltage (Vn). At operation 706, Vp and Vn may be compared. Comparator circuitry may be used to compare and provide an output, and in conjunction with logic and decoder circuitry may be used to switch a conductance of a digital-to-analog conversion circuit based on the output or result of the comparison operation 706.

For example, at operation 708, a positive input-side conductance of a digital-to-analog conversion circuit may be increased and a negative input-side conductance of the digital-to-analog conversion circuit may be decreased if Vp is greater than Vn. In certain configurations, the positive input-side conductance may be increased by 0.5 and the negative input-side conductance may be decreased by 0.5 (the result of which is equivalent to a +2Vref increase in accordance with some implementations). If Vp is less than Vn, then, at operation 710, the positive input-side conductance of the digital-to-analog conversion circuit may be decreased and the negative input-side conductance of the digital-to-analog conversion circuit may be increased, for example. In certain configurations, the positive input-side conductance may be decreased by 0.5 and the negative input-side conductance may be increased by 0.5 (the result of which is equivalent to a −2Vref decrease in accordance with some implementations).

Still referring to FIG. 19, at operation 712, a second positive input voltage (Vp') and a second negative input voltage (Vn') may be generated from the digital-to-analog conversion circuit. Vp' and Vn' may be used as residue voltage in an (N+1) pipeline analog-to-digital converter stage. Next, at operation 714, sampling capacitors may be reset and the digital-to-analog conversion circuit may be switched back to its initial conductance value. Once the resetting aspects of operation 714 are released, method 700 returns to operation 702.

Method 700 may be implemented with a pipeline ADC that utilizes switchable conductance (in other words, parallelized switchable resistance) digital-to-analog conversion circuits in the feed forward path of a plurality of pipeline stage. It is understood that while method 700 may be implemented in conjunction with the examples of a pipeline ADC described herein, method 700 is not limited to any particular hardware configuration or implementation.

It is to be appreciated that various aspects and implementations of the subject technology disclosed herein may further include and/or incorporate a number of calibration techniques; circuit design provisions providing necessary hooks and knobs for tuning and calibration purposes; a number of digital error correction schemes for combine and aligning digital data; a variety of voltage-to-current conversion designs; a variety of comparator designs; a variety of decoding logic designs; and a variety of clocking designs configured to generate proper clock phases. Certain features and/or characteristics from other types of analog-to-digital conversion architectures and technologies may be included with various implementations and configurations of a pipeline analog-to-digital converter using switchable conductance.

Aspects and implementations of the subject technology may be utilized in a wide range of applications, such as, but not limited to, pipeline ADC architectures in coherent transceivers and Gigabit-Ethernet circuitry.

Illustration of Subject Technology as Clauses

Various examples of aspects of the disclosure are described as numbered clauses (1, 2, 3, etc.) for convenience. These are provided as examples, and do not limit the subject technology. Identifications of the figures and reference numbers are provided below merely as examples and for illustrative purposes, and the clauses are not limited by those identifications.

1. A pipeline analog-to-digital converter (ADC) comprising:
   a plurality of stages, each of the plurality of stages comprising:
      an analog-to-digital conversion circuit comprising a comparator configured to produce an n-bit digital domain output; and
      a switchable conductance digital-to-analog conversion circuit operatively coupled to the comparator and configured to switch between at least two conductance values in response to a value of the n-bit digital domain output.

2. The pipeline ADC of clause 1 or any other clauses, wherein the switchable conductance digital-to-analog conversion circuit comprises a set of resistors and a set of switches, and wherein the set of switches is responsive to an output of the comparator.

3. The pipeline ADC of clause 2 or any other clauses, wherein the set of resistors comprises a first resistive element and a second resistive element and the set of switches comprises a first switch, wherein at least the first resistive element is arranged in parallel with a combination of the first switch in series with the second resistive element.

4. The pipeline ADC of clause 3 or any other clauses, wherein the analog-to-digital conversion circuit comprises one or more analog-to-digital stage resistive elements, and a resistance value of a first analog-to-digital stage resistive element of the one or more analog-to-digital stage resistive elements is the resistance value of a parallel combination of the first and second resistive elements of the switchable conductance digital-to-analog conversion circuit.

5. The pipeline ADC of clause 2 or any other clauses, wherein one or more switches of the set of switches comprise one or more of a PMOS (p-channel) transistor, an NMOS (n-channel) transistor, or a pass gate switch comprising one or more PMOS (p-channel) transistors and one or more NMOS (n-channel) transistors.

6. The pipeline ADC of clause 1 or any other clauses, wherein the at least two conductance values of the switchable conductance digital-to-analog conversion circuit are based on a fixed conductance value associated with the analog-to-digital conversion circuit, and wherein the comparator comprises latch and decoder circuitry for switching between the at least two conductance values based on a difference between a positive input voltage (Vp) and a negative input voltage (Vn).

7. The pipeline ADC of clause 1 or any other clauses, wherein the analog-to-digital conversion circuit comprises a 1-bit analog-to-digital conversion circuit, and the n-bit digital domain output comprises a 1-bit digital domain output.

8. The pipeline ADC of clause 1 or any other clauses, wherein the analog-to-digital conversion circuit comprises coarse analog-to-digital conversion circuitry.

9. The pipeline ADC of clause 1 or any other clauses, wherein the analog-to-digital conversion circuit and the conductance digital-to-analog conversion circuit are self-balancing such that no external reference voltages are utilized.

10. The pipeline ADC of clause 1 or any other clauses, wherein each of the plurality of stages does not include high-gain and high-precision operational amplifiers for inter-stage gain circuitry.

11. The pipeline ADC of clause 1 or any other clauses, wherein each of the plurality of stages further comprises:
    a first voltage-to-current converter operatively coupled to the analog-to-digital conversion circuit; and
    a second voltage-to-current converter operatively coupled to the switchable conductance digital-to-analog conversion circuit.

12. The pipeline ADC of clause 11 or any other clauses, wherein each of the plurality of stages further comprises:
    a sample-and-hold circuit operatively coupled to the first voltage-to-current converter and the second voltage-to-current converter.

13. The pipeline ADC of clause 1 or any other clauses, wherein each of the plurality of stages further comprises:
    one or more output source follower circuits operatively coupled to the switchable conductance digital-to-analog conversion circuit and for providing residue voltages to a subsequent stage.

14. The pipeline ADC of clause 1 or any other clauses, further comprising:
    clocking circuitry configured to provide a first clocking signal and a second clocking signal, the first clocking signal having a first phase rise time segment and a first phase fall time segment, and the second clocking signal having a second phase rise time segment and a second phase fall time segment,
    wherein a preamplifier of the comparator in an (N) stage of the plurality of stages is configured to be off during the first phase rise time segment and the first phase fall time segment, and the preamplifier of the comparator in the (N) stage is configured to be off during the second phase rise time segment and active during the second phase fall time segment.

15. The pipeline ADC of clause 14 or any other clauses, wherein a preamplifier of the comparator in an (N+1) stage of the plurality of stages is configured to be off during the first phase rise time segment and active during the first phase fall time segment, and the preamplifier of the comparator in the (N+1) stage is configured to be off during the second phase rise time segment and the second phase fall time.

16. The pipeline ADC of clause 14 or any other clauses, wherein the comparator in the (N) stage is configured to reset the switchable conductance digital-to-analog conversion circuit to an initial conductance value configuration during a first phase fall-delay time segment of the first clocking signal, and the analog-to-digital conversion circuit is configured to operate in a quantization phase for producing the n-bit digital domain output during a second phase fall-delay time segment of the second clocking signal.

17. The pipeline ADC of clause 1 or any other clauses, further comprising:
    an end-stage analog-to-digital conversion circuit operatively coupled to a last of the plurality of stages.

18. The pipeline ADC of clause 17 or any other clauses, wherein the end-stage analog-to-digital conversion circuit comprises an n-bit coarse flash analog-to-digital conversion circuit.

19. A method of analog-to-digital conversion, the method comprising:
    setting a current difference in an (N) pipeline analog-to-digital converter stage to produce a first positive input voltage (Vp) and a first negative input voltage (Vn);
    comparing the first positive input voltage (Vp) and the first negative input voltage (Vn); and
    switching conductance of a digital-to-analog conversion circuit based on said comparing the first positive input voltage (Vp) and the first negative input voltage (Vn).

20. The method of clause 19 or any other clauses, further comprising:
    generating, from the digital-to-analog conversion circuit, a second positive input voltage (Vp') and a second negative input voltage (Vn') for use as residue voltage in an (N+1) pipeline analog-to-digital converter stage, and wherein said switching conductance of a digital-to-analog conversion circuit further comprises:
        increasing a positive input-side conductance and decreasing a negative input-side conductance of the digital-to-analog conversion circuit if the first positive input voltage (Vp) is greater than the first negative input voltage (Vn); and
        decreasing the positive input-side conductance and increasing the negative input-side conductance of the digital-to-analog conversion circuit if the first positive input voltage (Vp) is less than the first negative input voltage (Vn).

21. A device for performing analog-to-digital conversion, the device comprising:
    means for setting a current difference in an (N) pipeline analog-to-digital converter stage to produce a first positive input voltage (Vp) and a first negative input voltage (Vn);
    means for comparing the first positive input voltage (Vp) and the first negative input voltage (Vn); and
    means for switching conductance of a digital-to-analog conversion circuit based on said comparing the first positive input voltage (Vp) and the first negative input voltage (Vn).

22. The device of clause 21 or any other clauses, further comprising:
    means for generating, from the digital-to-analog conversion circuit, a second positive input voltage (Vp') and a second negative input voltage (Vn') for use as residue voltage in an (N+1) pipeline analog-to-digital converter stage, and wherein the means for switching conductance of a digital-to-analog conversion circuit further comprises:

means for increasing a positive input-side conductance and decreasing a negative input-side conductance of the digital-to-analog conversion circuit if the first positive input voltage (Vp) is greater than the first negative input voltage (Vn); and means for decreasing the positive input-side conductance and means for increasing the negative input-side conductance of the digital-to-analog conversion circuit if the first positive input voltage (Vp) is less than the first negative input voltage (Vn).

A method may comprise one or more of the operations set forth in one or more of the foregoing clauses.

A device may comprise means for carrying out one or more of the operations set forth in one or more of the foregoing clauses.

A device may comprise components operable to carry out one or more of the operations set forth in one or more of the foregoing clauses.

A device may comprise means adapted for performing one or more of the operations set forth in one or more of the foregoing clauses.

Other Remarks

In one aspect, any of the clauses herein may depend from any one of the independent clauses or any one of the dependent clauses. In one aspect, any of the clauses (e.g., dependent or independent clauses) may be combined with any other one or more clauses (e.g., dependent or independent clauses). In one aspect, a claim may include some or all of the words (e.g., steps, operations, means or components) recited in a clause, a sentence, a phrase or a paragraph. In one aspect, a claim may include some or all of the words recited in one or more clauses, sentences, phrases or paragraphs. In one aspect, some of the words in each of the clauses, sentences, phrases or paragraphs may be removed. In one aspect, additional words or elements may be added to a clause, a sentence, a phrase or a paragraph. In one aspect, the subject technology may be implemented without utilizing some of the components, elements, functions or operations described herein. In one aspect, the subject technology may be implemented utilizing additional components, elements, functions or operations.

In one aspect, any methods, instructions, code, means, logic, components, blocks, modules and the like (e.g., software or hardware) described or claimed herein can be represented in drawings (e.g., flow charts, block diagrams), such drawings (regardless of whether explicitly shown or not) are expressly incorporated herein by reference, and such drawings (if not yet explicitly shown) can be added to the disclosure without constituting new matter. For brevity, some (but not necessarily all) of the clauses/descriptions/claims are explicitly represented in drawings, but any of the clauses/descriptions/claims can be represented in drawings in a manner similar to those drawings explicitly shown. For example, a flow chart can be drawn for any of the clauses, sentences or claims for a method such that each operation or step is connected to the next operation or step by an arrow. In another example, a block diagram can be drawn for any of the clauses, sentences or claims having means—for elements (e.g., means for performing an action) such that each means—for element can be represented as a module for element (e.g., a module for performing an action).

Those of skill in the art would appreciate that items such as the various illustrative blocks, modules, elements, components, methods, operations, steps, and algorithms described herein (e.g., pipeline ADC stage 100 and the components therein) may be implemented as hardware or a combination of hardware and software.

To illustrate the interchangeability of hardware and software, items such as the various illustrative blocks, modules, elements, components, methods, operations, steps, and algorithms have been described generally in terms of their functionality. Whether such functionality is implemented as hardware or software depends upon the particular application and design constraints imposed on the overall system. Skilled artisans may implement the described functionality in varying ways for each particular application.

In one aspect, "means," a block, a module, an element, a component or a processor may be an item (e.g., one or more of blocks, modules, elements, components or processors) for performing one or more functions or operations. In one aspect, such an item may be an apparatus, hardware, or a portion thereof. In an example, an item may be implemented as one or more circuits configured to perform the function(s) or operation(s). A circuit may include one or more circuits and/or logic. A circuit may be analog and/or digital. A circuit may be electrical and/or optical. A circuit may include transistors. In an example, one or more items may be implemented as a processing system (e.g., a digital signal processor (DSP), an application specific integrated circuit (ASIC), a field programmable gate array (FPGA), etc.), a portion(s) or a combination(s) of any of the foregoing. In one example, an item may have a structure in the form of, for example, an instruction(s) encoded or stored on a machine-readable medium, on another device, or on a portion thereof. An instruction(s) may be software, an application(s), a subroutine(s), or a portion thereof for performing the function(s) or operation(s). The instruction(s) may be executable by one or more processors. Those skilled in the art will recognize how to implement the circuits, processing systems, instructions and a combination thereof.

In one aspect of the disclosure, when actions or functions (e.g., sampling, setting, comparing, switching, increasing, decreasing, generating, resetting, and releasing) are described as being performed by an item (e.g., one or more of blocks, modules, elements, components or processors), it is understood that such actions or functions may be performed, for example, by the item directly. In another example, when an item is described as performing an action, the item may be understood to perform the action indirectly, for example, by facilitating such an action (e.g., assisting, allowing, enabling, causing, or providing for, such action to occur; or performing a portion of such an action). For example, sampling can refer to facilitating sampling, comparing can refer to facilitating comparing, and switching can refer to facilitating switching. In one aspect, performing an action may refer to performing a portion of the action (e.g., performing a beginning part of the action, performing an end part of the action, or performing a middle portion of the action).

In one aspect, the term "bipolar junction transistor (BJT)" may refer to any of a variety of multi-terminal transistors generally operating on the principal of carrying current using both electrons and holes, including but not limited to an n-p-n BJT, and a p-n-p BJT.

In one aspect, the term "field effect transistor (FET)" may refer to any of a variety of multi-terminal transistors generally operating on the principals of controlling an electric field to control the shape and hence the conductivity of a channel of one type of charge carrier in a semiconductor material, including, but not limited to, a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET).

In one aspect, the terms "base," "emitter," and "collector" may refer to three terminals of a transistor and may refer to a base, an emitter and a collector of a bipolar junction transistor or may refer to a gate, a source, and a drain of a field effect transistor, respectively, and vice versa. In another aspect, the terms "gate," "source," and "drain" may refer to "base," "emitter," and "collector" of a transistor, respectively, and vice versa.

Unless otherwise mentioned, various configurations described in the present disclosure may be implemented on a Silicon, Silicon-Germanium (SiGe), Gallium Arsenide (GaAs), Indium Phosphide (InP) or Indium Gallium Phosphide (InGaP) substrate, or any other suitable substrate.

A reference to an element in the singular is not intended to mean "one and only one" unless specifically so stated, but rather "one or more." For example, a clocking signal may refer to one or more clocking signals, an input signal may refer to one or more input signals, an output signal may refer to one or more output signals, and a signal may refer to differential voltage signals.

Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The word "exemplary" is used herein to mean "serving as an example or illustration." Any aspect or design described herein as "exemplary" is not necessarily to be construed as preferred or advantageous over other aspects or designs. In one aspect, various alternative configurations and operations described herein may be considered to be at least equivalent.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

In one aspect, unless otherwise stated, all measurements, values, ratings, positions, magnitudes, sizes, and other specifications that are set forth in this specification, including in the claims that follow, are approximate, not exact. In one aspect, they are intended to have a reasonable range that is consistent with the functions to which they relate and with what is customary in the art to which they pertain.

In one aspect, the term "coupled," "operatively coupled" or the like may refer to being directly coupled. In another aspect, the term "coupled," "operatively coupled" or the like may refer to being indirectly coupled.

Various items may be arranged differently (e.g., arranged in a different order, or partitioned in a different way) all without departing from the scope of the subject technology. In one aspect of the disclosure, the elements recited in the accompanying claims may be performed by one or more modules or sub-modules.

It is understood that the specific order or hierarchy of steps, operations or processes disclosed is an illustration of exemplary approaches. Based upon design preferences, it is understood that the specific order or hierarchy of steps, operations or processes may be rearranged. Some of the steps, operations or processes may be performed simultaneously. The accompanying method claims, if any, present elements of the various steps, operations or processes in a sample order, and are not meant to be limited to the specific order or hierarchy presented.

The disclosure is provided to enable any person skilled in the art to practice the various aspects described herein. The disclosure provides various examples of the subject technology, and the subject technology is not limited to these examples. Various modifications to these aspects will be readily apparent to those skilled in the art, and the generic principles defined herein may be applied to other aspects.

It is to be appreciated that one or more aspects of the subject technology may be used in various applications. For example, a pipeline ADC stage may be configured to resolve 1.5-bits or any number of bits in accordance with some aspects.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used, such term is intended to be inclusive in a manner similar to the term "comprise" as "comprise" is interpreted when employed as a transitional word in a claim.

The Title, Background, Summary, Brief Description of the Drawings and Abstract of the disclosure are hereby incorporated into the disclosure and are provided as illustrative examples of the disclosure, not as restrictive descriptions. It is submitted with the understanding that they will not be used to limit the scope or meaning of the claims. In addition, in the Detailed Description, it can be seen that the description provides illustrative examples and the various features are grouped together in various embodiments for the purpose of streamlining the disclosure. This method of disclosure is not to be interpreted as reflecting an intention that the claimed subject matter requires more features than are expressly recited in each claim. Rather, as the following claims reflect, inventive subject matter lies in less than all features of a single disclosed configuration or operation. The following claims are hereby incorporated into the Detailed Description, with each claim standing on its own as a separately claimed subject matter.

The claims are not intended to be limited to the aspects described herein, but is to be accorded the full scope consistent with the language claims and to encompass all legal equivalents. Notwithstanding, none of the claims are intended to embrace subject matter that fails to satisfy the requirement of 35 U.S.C. §101, 102, or 103, nor should they be interpreted in such a way. Any unintended embracement of such subject matter is hereby disclaimed.

What is claimed is:

1. A pipeline analog-to-digital converter (ADC) comprising:
a plurality of stages, each of the plurality of stages comprising:
an analog-to-digital conversion circuit comprising a comparator configured to produce an n-bit digital domain output; and
a switchable conductance digital-to-analog conversion circuit operatively coupled to the comparator and configured to switch between at least two conductance values in response to a value of the n-bit digital domain output.

2. The pipeline ADC of claim 1, wherein the switchable conductance digital-to-analog conversion circuit comprises a set of resistors and a set of switches, and wherein the set of switches is responsive to an output of the comparator.

3. The pipeline ADC of claim 2, wherein the set of resistors comprises a first resistive element and a second resistive element and the set of switches comprises a first switch, wherein at least the first resistive element is arranged in parallel with a combination of the first switch in series with the second resistive element.

4. The pipeline ADC of claim 3, wherein the analog-to-digital conversion circuit comprises one or more analog-to-digital stage resistive elements, and a resistance value of a first analog-to-digital stage resistive element of the one or more analog-to-digital stage resistive elements is the resistance value of a parallel combination of the first and second resistive elements of the switchable conductance digital-to-analog conversion circuit.

5. The pipeline ADC of claim 2, wherein one or more switches of the set of switches comprise one or more of a PMOS (p-channel) transistor, an NMOS (n-channel) transistor, or a pass gate switch comprising one or more PMOS (p-channel) transistors and one or more NMOS (n-channel) transistors.

6. The pipeline ADC of claim 1, wherein the at least two conductance values of the switchable conductance digital-to-analog conversion circuit are based on a fixed conductance value associated with the analog-to-digital conversion circuit, and wherein the comparator comprises latch and decoder circuitry for switching between the at least two conductance values based on a difference between a positive input voltage (Vp) and a negative input voltage (Vn).

7. The pipeline ADC of claim 1, wherein the analog-to-digital conversion circuit comprises a 1-bit analog-to-digital conversion circuit, and the n-bit digital domain output comprises a 1-bit digital domain output.

8. The pipeline ADC of claim 1, wherein the analog-to-digital conversion circuit comprises coarse analog-to-digital conversion circuitry.

9. The pipeline ADC of claim 1, wherein the analog-to-digital conversion circuit and the conductance digital-to-analog conversion circuit are self-balancing such that no external reference voltages are utilized.

10. The pipeline ADC of claim 1, wherein each of the plurality of stages does not include high-gain and high-precision operational amplifiers for inter-stage gain circuitry.

11. The pipeline ADC of claim 1, wherein each of the plurality of stages further comprises:

a first voltage-to-current converter operatively coupled to the analog-to-digital conversion circuit; and
a second voltage-to-current converter operatively coupled to the switchable conductance digital-to-analog conversion circuit.

12. The pipeline ADC of claim 11, wherein each of the plurality of stages further comprises:
a sample-and-hold circuit operatively coupled to the first voltage-to-current converter and the second voltage-to-current converter.

13. The pipeline ADC of claim 1, wherein each of the plurality of stages further comprises:
one or more output source follower circuits operatively coupled to the switchable conductance digital-to-analog conversion circuit and for providing residue voltages to a subsequent stage.

14. The pipeline ADC of claim 1, further comprising:
clocking circuitry configured to provide a first clocking signal and a second clocking signal, the first clocking signal having a first phase rise time segment and a first phase fall time segment, and the second clocking signal having a second phase rise time segment and a second phase fall time segment,
wherein a preamplifier of the comparator in an (N) stage of the plurality of stages is configured to be off during the first phase rise time segment and the first phase fall time segment, and the preamplifier of the comparator in the (N) stage is configured to be off during the second phase rise time segment and active during the second phase fall time segment.

15. The pipeline ADC of claim 14, wherein a preamplifier of the comparator in an (N+1) stage of the plurality of stages is configured to be off during the first phase rise time segment and active during the first phase fall time segment, and the preamplifier of the comparator in the (N+1) stage is configured to be off during the second phase rise time segment and the second phase fall time.

16. The pipeline ADC of claim 14, wherein the comparator in the (N) stage is configured to reset the switchable conductance digital-to-analog conversion circuit to an initial conductance value configuration during a first phase fall-delay time segment of the first clocking signal, and the analog-to-digital conversion circuit is configured to operate in a quantization phase for producing the n-bit digital domain output during a second phase fall-delay time segment of the second clocking signal.

17. The pipeline ADC of claim 1, further comprising:
an end-stage analog-to-digital conversion circuit operatively coupled to a last of the plurality of stages.

18. The pipeline ADC of claim 17, wherein the end-stage analog-to-digital conversion circuit comprises an n-bit coarse flash analog-to-digital conversion circuit.

19. A method of analog-to-digital conversion, the method comprising:
setting a current difference in an (N) pipeline analog-to-digital converter stage to produce a first positive input voltage (Vp) and a first negative input voltage (Vn);
comparing the first positive input voltage (Vp) and the first negative input voltage (Vn); and
switching conductance of a digital-to-analog conversion circuit based on said comparing the first positive input voltage (Vp) and the first negative input voltage (Vn).

20. The method of claim 19, further comprising:
generating, from the digital-to-analog conversion circuit, a second positive input voltage (Vp') and a second negative input voltage (Vn') for use as residue voltage in an (N+1) pipeline analog-to-digital converter stage, and wherein said switching conductance of a digital-to-analog conversion circuit further comprises:

increasing a positive input-side conductance and decreasing a negative input-side conductance of the digital-to-analog conversion circuit if the first positive input voltage (Vp) is greater than the first negative input voltage (Vn); and decreasing the positive input-side conductance and increasing the negative input-side conductance of the digital-to-analog conversion circuit if the first positive input voltage (Vp) is less than the first negative input voltage (Vn).

21. A device for performing analog-to-digital conversion, the device comprising:

means for setting a current difference in an (N) pipeline analog-to-digital converter stage to produce a first positive input voltage (Vp) and a first negative input voltage (Vn);

means for comparing the first positive input voltage (Vp) and the first negative input voltage (Vn); and means for switching conductance of a digital-to-analog conversion circuit based on said comparing the first positive input voltage (Vp) and the first negative input voltage (Vn).

22. The device of claim 21, further comprising:

means for generating, from the digital-to-analog conversion circuit, a second positive input voltage (Vp') and a second negative input voltage (Vn') for use as residue voltage in an (N+1) pipeline analog-to-digital converter stage, and wherein the means for switching conductance of a digital-to-analog conversion circuit further comprises:

means for increasing a positive input-side conductance and decreasing a negative input-side conductance of the digital-to-analog conversion circuit if the first positive input voltage (Vp) is greater than the first negative input voltage (Vn); and means for decreasing the positive input-side conductance and means for increasing the negative input-side conductance of the digital-to-analog conversion circuit if the first positive input voltage (Vp) is less than the first negative input voltage (Vn).

\* \* \* \* \*